(12) United States Patent
Kim et al.

(10) Patent No.: US 9,661,744 B2
(45) Date of Patent: May 23, 2017

(54) TOUCH PANEL HAVING A SENSING ELECTRODE AND A PRINTING ELECTRODE

(71) Applicant: LG INNOTEK CO., LTD., Seoul (KR)

(72) Inventors: Soo Keun Kim, Seoul (KR); Ji Chang Ryu, Seoul (KR); Jae Hak Her, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/746,984

(22) Filed: Jun. 23, 2015

(65) Prior Publication Data

US 2015/0373839 A1 Dec. 24, 2015

(30) Foreign Application Priority Data

| Jun. 24, 2014 | (KR) | 10-2014-0077392 |
| Jun. 26, 2014 | (KR) | 10-2014-0079214 |
| Jul. 1, 2014 | (KR) | 10-2014-0081681 |
| Jul. 1, 2014 | (KR) | 10-2014-0081682 |

(51) Int. Cl.
*G06F 3/045* (2006.01)
*H05K 1/02* (2006.01)
(Continued)

(52) U.S. Cl.
CPC ....... *H05K 1/0271* (2013.01); *G06F 3/03545* (2013.01); *G06F 3/044* (2013.01); *G06F 3/047* (2013.01); *G06F 3/0412* (2013.01); *H05K 1/0274* (2013.01); *G06F 2203/04101* (2013.01); *G06F 2203/04107* (2013.01); *G06F 2203/04111* (2013.01); *G06F 2203/04112* (2013.01);
(Continued)

(58) Field of Classification Search
CPC .............. H05K 1/0271; H05K 1/0274; H05K 2201/0145; G06F 3/03545; G06F 3/0412; G06F 3/044; G06F 3/047; G06F 2203/04101; G06F 2203/04107; G06F 2203/04111; G06F 2203/04112; G06F 2203/04808; G06F 2203/04809
See application file for complete search history.

(56) References Cited

U.S. PATENT DOCUMENTS

2011/0291987 A1 12/2011 Wang et al.
2012/0105344 A1 5/2012 Ko et al.
(Continued)

FOREIGN PATENT DOCUMENTS

EP 2 579 134 A2 4/2013
KR 10-2011-0017569 A 2/2011
(Continued)

OTHER PUBLICATIONS

European Search Report dated Nov. 4, 2015 issued in Application No. 15173127.0.
(Continued)

*Primary Examiner* — Peter D McLoone
(74) *Attorney, Agent, or Firm* — KED & Associates LLP

(57) ABSTRACT

Provided is a touch panel including a cover substrate including an active area and an unactive area, and a printing layer on the unactive area. The printing layer has surface roughness in a range of 0.4 μm to 0.6 μm. The printing layer has straightness in a range of ±0.1 μm to ±10 μm.

17 Claims, 18 Drawing Sheets

(51) Int. Cl.
    *G06F 3/044* (2006.01)
    *G06F 3/0354* (2013.01)
    *G06F 3/041* (2006.01)
    *G06F 3/047* (2006.01)

(52) U.S. Cl.
    CPC .............. *G06F 2203/04808* (2013.01); *G06F 2203/04809* (2013.01); *H05K 2201/0145* (2013.01)

(56) References Cited

U.S. PATENT DOCUMENTS

| | | | |
|---|---|---|---|
| 2013/0009886 A1* | 1/2013 | Wu | G06F 3/041 345/173 |
| 2013/0088281 A1 | 4/2013 | Wang et al. | |
| 2013/0269988 A1 | 10/2013 | Wang et al. | |
| 2014/0118832 A1 | 5/2014 | Gil et al. | |
| 2014/0132861 A1 | 5/2014 | Wang et al. | |
| 2014/0168099 A1 | 6/2014 | Lee et al. | |
| 2015/0253809 A1 | 9/2015 | Hata et al. | |
| 2016/0202812 A1* | 7/2016 | Pyoun | G06F 3/0412 345/173 |

FOREIGN PATENT DOCUMENTS

| | | | |
|---|---|---|---|
| KR | 10-2012-0045292 A | 5/2012 |
| KR | 10-2013-0017901 A | 2/2013 |
| KR | 10-2014-0039978 A | 4/2014 |
| KR | 10-2014-0057161 A | 5/2014 |
| WO | WO 2014/069387 A1 | 5/2014 |

OTHER PUBLICATIONS

European Office Action for Application 15 173 127.0 dated Jul. 12, 2016.

European Examination Report issued in EP 15 173 127.0 dated Apr. 4, 2017.

S. Jiguet et al., "Conductive SU8 Photoresist for Microfabrication," Advanced Functional Materials, vol. 15, No. 9, Sep. 1, 2005 (Sep. 1, 2005) pp. 1511-1516, XP05539187; DE ISSN: 1616-301X, DOI: 10.1002/adfm.200400575.

* cited by examiner

TOUCH PANEL HAVING A SENSING ELECTRODE AND A PRINTING ELECTRODE

CROSS-REFERENCE TO RELATED APPLICATIONS

This application claims priority under 35 U.S.C. §119 to Korean Application No. 10-2014-0077392 filed Jun. 24, 2014, No. 10-2014-0079214 filed Jun. 26, 2014, No. 10-2014-0081681 filed Jul. 1, 2014 and No. 10-2014-0081682 filed Jul. 1, 2014, whose entire disclosures are hereby incorporated by reference.

BACKGROUND

1. Field

This disclosure relates to a touch panel.

2. Background

Recently, a touch panel, which performs an input function through the touch to an image displayed on a display device by an input device, such as a stylus pen or a finger, has been applied to various electronic appliances. The touch panel includes a cover substrate having an active area to sense a position and an unactive area provided at a peripheral portion of the active area. A printing layer may be provided in the unactive area. The printing layer may be printed with a material representing a predetermined color so that a wire electrode and a printed circuit board to connect the wire electrode with an external circuit are not viewed from an outside.

The printing layer may be printed on the cover substrate through various schemes. In this case, the deviation in the surface roughness and the straightness of the printing layer may exert an influence on reliability. For example, in the case of the high surface roughness, when an electrode is provided on the printing layer, an electrode may be damaged by protrusions of a printing layer. In the case of the great deviation of straightness, the printing layer may be printed to an active part, so that the active area, that is, the display area may be reduced.

The printing layer is provided with a predetermined height, that is, a predetermined thickness on the cover substrate. The wire electrode, which is provided on the printing layer, and the sensing electrode, which is provided on the cover substrate, make contact with each other so that the wire electrode can be connected with the sensing electrode.

However, as the sensing electrode is connected with the wire electrode provided on the printing layer, the sensing electrode is shorted due to the step difference resulting from the height of the printing layer, so that the reliability may be deteriorated.

The sensing electrode may include a plurality of electrode parts, the electrode parts may be spaced apart from each other, and the electrode parts may be connected with each other through a bridge electrode. For example, an insulating layer may be interposed between second sensing electrodes, and a bridge electrode is formed on the insulating layer to connect the electrode parts of the sensing electrodes, which are spaced apart from each other, with each other. In this case, the alignment of the second sensing electrode, the insulating layer, and the bridge electrode may be difficult.

In this case, at least one wire may be formed to be spaced apart from the sensing electrode. A junction part is required to electrically connect the wire and the sensing electrode, which are spaced apart from each other, with each other. The junction part may be formed through a printing process. However, when the junction part is formed through the printing process, the entire surface of the substrate may be heated. Accordingly, as the entire surface of the substrate is heated, the substrate may be deformed. In particular, a material, such as polyethylene terephthalate (PET), weak against heat may have a limitation in a heating temperature.

Accordingly, the touch panel having a novel structure to solve the above problem is required.

BRIEF DESCRIPTION OF THE DRAWINGS

The embodiments will be described in detail with reference to the following drawings in which like reference numerals refer to like elements wherein.

DETAILED DESCRIPTION

Figure 1:
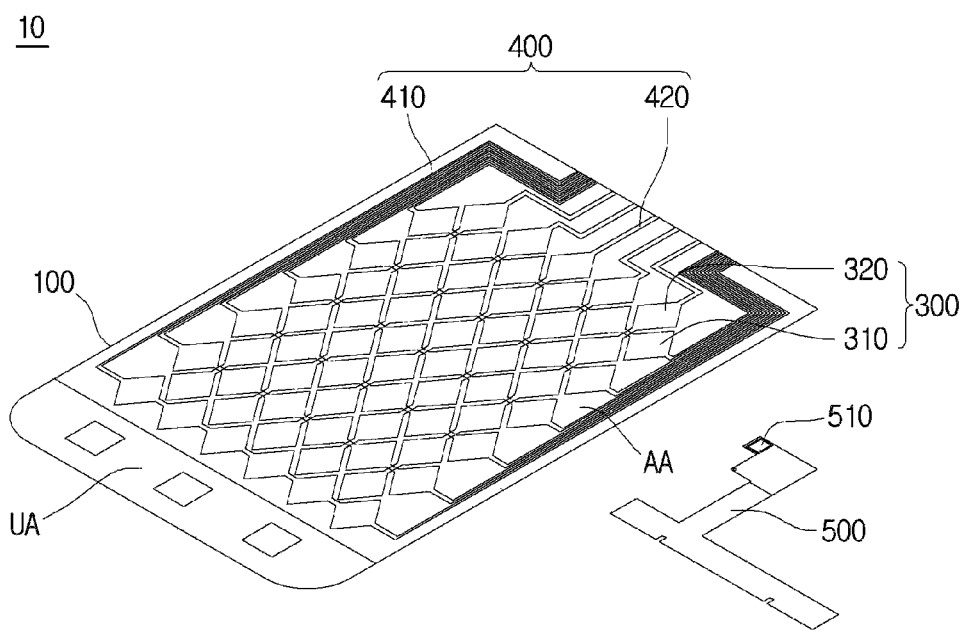
FIG. 1 is a perspective view showing a touch panel according to the embodiment.
Figure 2:
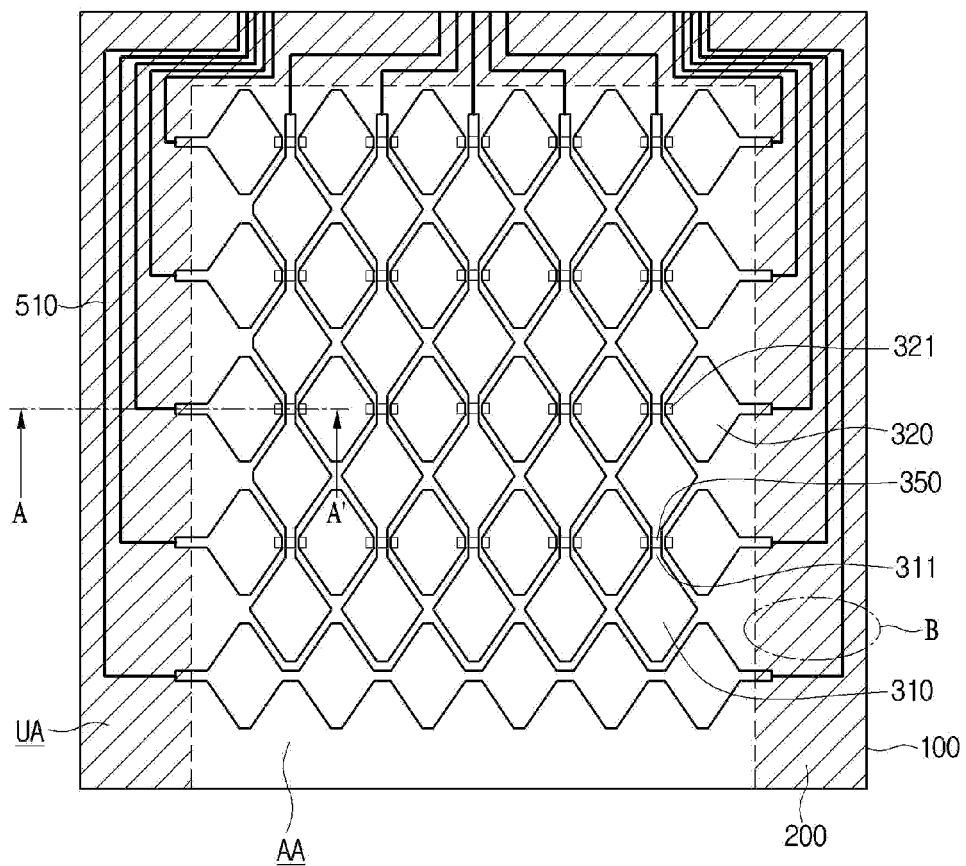
FIG. 2 is a plan view showing the touch panel according to the embodiment.
Figure 3:
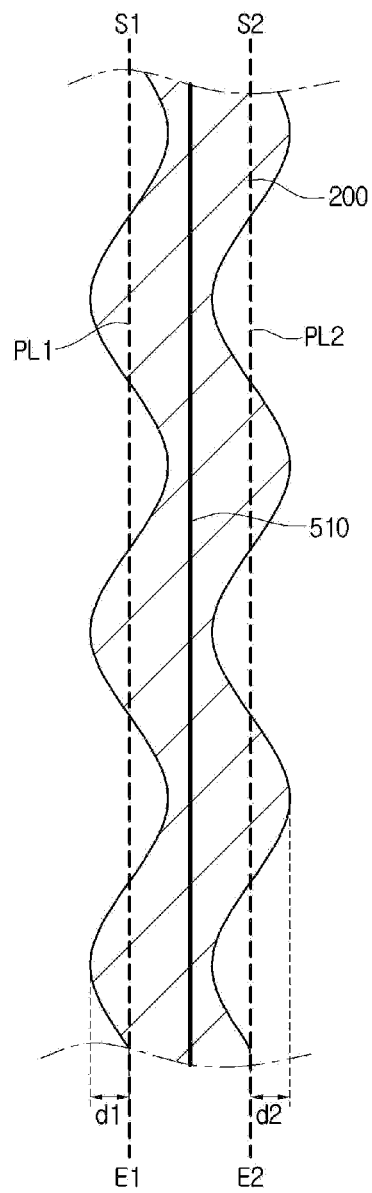
FIG. 3 is an enlarged view of an area B shown in FIG. 2.
Figure 4:
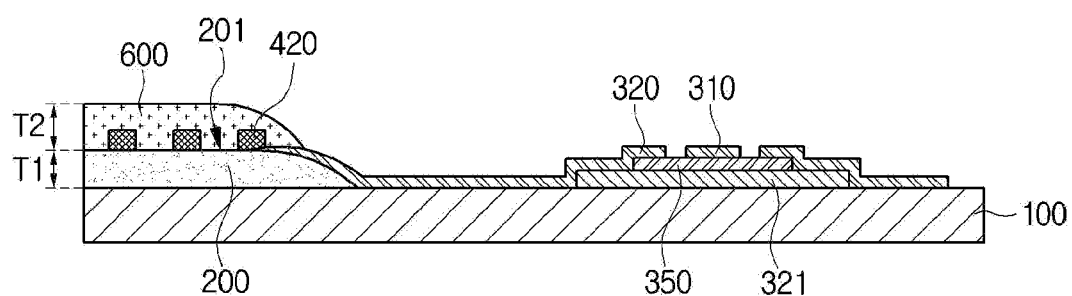
FIG. 4 is a sectional view taken along line A-A' of FIG. 2.
Figure 5:
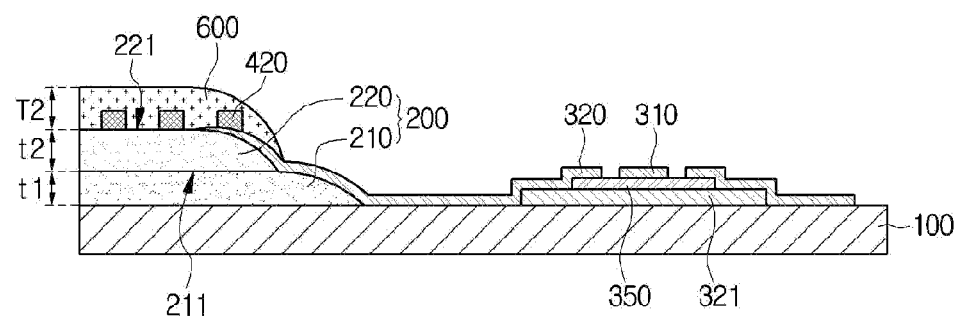
FIG. 5 is a sectional view taken along line A-A' of FIG. 2.

FIG. 1 is a perspective view showing a touch panel according to the embodiment. FIG. 2 is a plan view showing the touch panel according to the embodiment. FIG. 3 is an enlarged view of an area B shown in FIG. 2. FIG. 4 is a sectional view taken along line A-A' of FIG. 2. FIG. 5 is a sectional view taken along line A-A' of FIG. 2. A touch panel according to the embodiment may include a cover substrate 100, a printing layer 200, a sensing electrode 300, a wire electrode 400, and a printing circuit board 500.

The cover substrate 100 may support the printing layer 200, the sensing electrode 300, the wire electrode 400, and the printing circuit board 500. In other words, the cover substrate 100 may be a support substrate.

The cover substrate 100 may be flexible or rigid. For example, the cover substrate 100 may include glass or plastic. In detail, the cover substrate 100 may include chemically tempered/semi-tempered glass, such as soda lime glass or aluminosilicate glass, reinforced/flexible plastic, such as polyimide (PI), polyethylene terephthalate (PET), propylene glycol (PPG), or poly carbonate (PC), or sapphire. The sapphire has superior electric characteristics, such as permittivity, so that a touch response speed may be greatly increased and a space touch such as hovering may be easily implemented. In addition, since the sapphire has high surface hardness, the sapphire is applicable to a cover substrate. The hovering refers to a technique of recognizing coordinates even at a slight distance from a display.

The cover substrate 100 may have an active area AA and an unactive area UA. An image may be displayed in the unactive area AA, and may not be displayed in the unactive area UA provided at a peripheral portion of the active area AA.

A position of an input device (e.g., finger) can be detected in at least one of the active area AA and the unactive area UA. If the input device such as the finger touches the touch window, the variation of capacitance occurs in the touched part by the input device, and the touched part subject to the variation of the capacitance may be detected as a touch point.

The sensing electrode 300 may be provided on the cover substrate 100. In detail, the sensing electrode 300 may be provided on the active area AA of the cover substrate 100. In more detail, the sensing electrode 300 may extend from the active area AA of the cover substrate 100 toward the unactive area UA.

The sensing electrode 300 may include a conductive material. The sensing electrode 300 may include a transparent conductive material allowing current flow without the interruption of light transmission. For example, the sensing electrode 300 may include metal oxide such as indium tin oxide (ITO), indium zinc oxide (IZO), copper oxide, tin oxide, zinc oxide, or titanium oxide.

However, the embodiment is not limited thereto, but the sensing electrode 300 may include a nanowire film, a carbon nano tube (CNT), graphene, or conductive polymer. In addition, the sensing electrode 300 may include various metals. For example, the sensing electrode 300 may include at least one of metals such as chromium (Cr), nickel (Ni), copper (Cu), aluminum (Al), silver (Ag), and molybdenum (Mo). In this case, the sensing electrode 300 (or wire electrode 400) may be formed in a mesh shape. In detail, the sensing electrode 400 may include a plurality of sub-electrodes, and the sub-electrodes may be arranged in the mesh shape while crossing each other.

The sensing electrode 300 may include a first sensing electrode 310 and a second sensing electrode 320. The first sensing electrode 310 may extend in a first direction on the active area AA of the cover substrate 100. In detail, the first sensing electrode 310 may be provided on one surface of the cover substrate 100. For example, the first sensing electrode 310 may make contact with the one surface of the cover substrate 100.

In addition, the second sensing electrode 320 may extend in a second direction on the active area AA of the cover substrate 100. In detail, the second sensing electrode 320 may be provided on one surface of the cover substrate 100 while extending in the second direction different from the first direction. For example, the second sensing electrode 320 may make contact with the cover substrate 100. In other words, the first and second sensing electrodes 310 and 320 may be provided on the same surface of the cover substrate 100 while extending in directions different from each other.

The first and second sensing electrodes 310 and 320 may be insulated from each other on the cover substrate 100. In detail, first sensing electrodes 310 are connected with each other by a first connection electrode 311, an insulating layer 350 is provided at the first connection electrode 311, and a second connection electrode 321 is provided on the insulating layer 350 to connect second sensing electrodes 320 with each other.

The first connection electrode 311 electrically connects the first sensing electrodes 310 spaced apart from each other and electrically connects the second sensing electrodes 320 spaced apart from each other. The connection electrodes 311 and 321 may include a transparent conductive material allowing the flow of electricity without interrupting the transmittance of light. The connection electrodes 311 and 321 may be formed of the same material as that constituting the sensing electrode.

Accordingly, the first and second sensing electrodes 310 and 320 may be provided on the same surface of the cover substrate 100, that is, on one surface of the active area without the contact between the first and second sensing electrodes 310 and 320 while being insulated from each other.

Referring to FIG. 4, the printing layer 200 may be provided on the unactive area UA of the cover substrate 100. The printing layer 200 may have a thickness T1 in the range of about 1 µm to about 10 µm. In detail, the printing layer 200 has the thickness T1 in the range of about 1 µm to about 9 µm. In more detail, the printing layer 200 has the thickness T1 in the range of about 1.3 µm to about 2 µm.

The printing layer 200 may be printed on the cover substrate 100 through a screen printing scheme or a roll coating scheme. The printing layer 200 may be realized in various colors according to desirable appearances. In detail, the printing layer 200 may be realized in various colors such as black, white, blue or red.

The printing layer 200 may include a photoresist resin composition. For example, the printing layer 200 may include at least one of a diazo resin, azide resin, hard coated polyvinyl, acrylic resin, polyamide and polyester. For example, the printing layer 200 may include acrylic resin including an acrylic copolymer, a cross-lining agent, a photoinitiator, an additive, a diethylene glycol monoethyl ether acetate (DE acetate), or a diethylene glycol methyl ethyl ether (MEDG).

In detail, based on the whole content of the photoresist composition, the acrylic copolymer is contained with the content of about 15% by weight to about 25% by weight, the crosslinking agent is contained with the content of about 10% by weight to about 20% by weight, and the photoinitiator is contained with the content of about 1% by weight to about 3% by weight. The additives are contained with the content of about 4% by weight to about 6% by weight, and the DE Acetate is contained with the content of about 5% by weight to about 15% by weight. The MEDG may be contained with the content of about 30% by weight to about 70% by weight.

The printing layer includes the photoresist resin composition, so that the adhesion strength between the printing layer the cover substrate can be improved. Accordingly, the printing layer can be prevented from being delaminated from the cover substrate, so that the reliability of the touch panel can be improved.

The printing layer 200 may further include color ink. In detail, the printing layer 200 may include ink representing black, white, or blue, so that the printing layer 200 may be realized in desirable color. In addition, the printing layer 200 may be not opaque. In other words, the printing layer 200 may be translucent or opaque. Accordingly, the electrode or the printing circuit board provided on the printing layer 200 may not be viewed from the outside.

The printing layer 200 may have predetermined surface roughness. In detail, a surface 201 of the printing layer 200 may have surface roughness in a predetermined range. For example, the surface roughness of the printing layer 200 may be equal to or less than about 0.6 µm. In detail, the surface roughness of the printing layer 200 may be in the range of about 0.4 µm to about 0.6 µm.

When the surface roughness of the printing layer 200 exceeds about 0.6 µm, electrodes arranged on the printing layer may be damaged by protrusions formed on the printing layer so that the reliability of the electrodes may be degraded. The surface roughness of the printing layer 200, which is less than about 0.4 µm, may be difficult due to the fabrication process.

In addition, the printing layer 200 may have predetermined straightness. For example, the printing layer 200 may have the straightness equal to or less than about ±10 µm. In more detail, the printing layer 200 may have the straightness in the range of about ±0.1 µm to about ±10 µm. In more detail, the printing layer 200 may have the straightness in the range of about ±0.1 µm to about ±10 µm.

In this case, the straightness refers to a parallel degree of the printing layer 200. Referring to FIG. 3, when virtual parallel lines, that is, first and second parallel lines PL1 and PL2 are defined, the distance, by which the printing layer 200 deviates from the first parallel line PL1, is referred to as a first deviation d1, and the distance, by which the printing layer 200 deviates from the second parallel line PL2, is referred to as a second deviation d2, the sum of the first and second deviations d1 and d2 may represent the straightness. In other words, as the sum of the first and second deviations d1 and d2 is decreased, superior straightness may be represented. As the sum of the first and second deviations d1 and d2 is increased, the inferior straightness may be represented. In this case, the virtual parallel lines may be defined as lines obtained by linking starting points S1 and S2 of a printing layer with ending points E1 and E2 of the printing layer.

The printing layer 200 according to the present embodiment may have the straightness of about ±10 µm or less. In other words, when the first deviation d1 is −10 µm, and the second deviation d2 is +10 µm, the total deviations may be 20 µm or less. In detail, the printing layer 200 may have the straightness in the range of about ±0.1 µm to about ±10 µm.

If the straightness of the printing layer 200 exceeds about ±10 µm, a marginal area is increased when the printing layer 200 is formed, so that the unactive area UA, that is, a Bezel area of the touch panel may be increased. In addition, the printing layer is printed beyond the active area AA, so that the display area may be narrowed. In addition, the straightness of the printing layer 200, which is less than about ±5 µm may be difficult in the manufacturing process.

The wire electrode 400 may be provided on the unactive area UA of the cover substrate 100. In detail, the wire electrode 400 may be provided on the printing layer 200. The wire electrode 400 may be connected with the sensing electrode 300 and provided on the printing layer 200.

The wire electrode 400 may include first and second wire electrodes 410 and 420. In detail, the wire electrode 400 may include the first wire electrode 410 connected with the first sensing electrode 310 and the second wire electrode 420 connected with the second sensing electrode 320.

One end of the first wire electrode 410 and one electrode of the second wire electrode 420 may be connected with the sensing electrode 300, and opposite ends of the first and second wire electrodes 410 and 420 may be connected with the printed circuit board 500.

The wire electrode 400 may include a conductive material. For example, the wire electrode 400 may include a metallic material such as copper (Cu), or silver (Ag), but the embodiment is not limited thereto. The wire electrode 400 may include a transparent conductive material such as indium tin oxide.

The wire electrode 400 may be connected with the sensing electrode 300 on the printing layer 200. In detail, the sensing electrode 300 and the wire electrode 400 may directly or indirectly make contact with each other.

The wire electrode 400 receives the sensed touch signal from the sensing electrode 300, and the touch signal may be transmitted to a driving chip 510 mounted on the printed circuit board 500 electrically connected with the wire electrode 400 through the wire electrode 400.

The printed circuit board 500 may be provided on the unactive area UA. The printed circuit board 500 may include a flexible printed circuit board (FPCB). The printed circuit board 500 may be connected with the wire electrode 400 provided on the unactive area UA. In detail, the printed circuit board 500 may be electrically connected with the wire electrode 400 through an anisotropic conductive film (ACF) on the unactive area UA.

The driving chip 510 may be mounted on the printed circuit board 500. In detail, the driving chip 510 receives the touch signal sensed by the sensing electrode 300 from the wire electrode 400 so that the driving chip 510 may perform an operation according to the touch signal.

A protective layer 600 may be further provided on the printing layer 200. In detail, the protective layer 600 may be provided on the printing layer to cover the wire electrode 400. The protective layer 600 may be a passivation layer. The protective layer 600 may include a material the same as or different from a material constituting the printing layer 200. Preferably, the protection layer 600 may include a material different from that of the printing layer 200. For example, the protective layer 600 may include a material such as silicon dioxide ($SiO_2$).

The protective layer 600 may have a color the same as or similar to that of the printing layer 200. Preferably, the protective layer 600 may have a color corresponding to that of the printing layer 200. In addition, the protective layer 600 may be semi-transparent or opaque.

The protective layer 600 may have a thickness thicker than that of the printing layer 200. In detail, the protective layer 600 has a thickness T2 in the range of about 6 µm to about 10 µm. In more detail, the protective layer 600 has a thickness T2 in the range of about 7 µm to about 9 µm.

If the thickness of the protective layer 600 is less than about 6 µm, electrodes on the printing layer cannot be sufficiently protected from external foreign matters. If the thickness of the protective layer 600 exceeds about 10 µm, the whole thickness of the touch panel may be increased due to the protective layer 600. The protective layer 600 is provided on the printing layer 200 to protect the wire electrode 500 provided on the printing layer 200 from external foreign matters, and has the same color as that of the printing layer 200 to enhance the printing layer.

Although FIG. 4 shows that one printing layer is provided, the embodiment is not limited. As shown in FIG. 5, a plurality of printing layers may be provided. Referring to FIG. 5, the printing layer 200 may include a plurality of printing layers. For example, the printing layer 200 may include first and second printing layers 210 and 220. The first printing layer 210 makes contact with the cover substrate 100, and the second printing layer 220 may make contact with the first printing layer 210.

Although FIG. 5 shows only the first and second printing layers, the embodiment is not limited thereto. The printing layer may include a plurality of printing layers such as a third printing layer on the second printing layer. The first and second printing layers 210 and 220 may be provided with mutually different widths. Although FIG. 5 shows that the first printing layer 210 has a width wider than that of the second printing layer 220, the embodiment is not limited thereto. The second printing layer 220 may have a width wider than that of the first printing layer 210.

Each of the thickness t1 of the first printing layer 210 and the thickness t2 of the second printing layer 220 may be in the range of about 1 μm to about 10 μm. In detail, each of the thickness t1 of the first printing layer 210 and the thickness t2 of the second printing layer 220 may be in the range of about 1 μm to about 9 μm. In more detail, each of the thickness t1 of the first printing layer 210 and the thickness t2 of the second printing layer 220 may be in the range of about 1.3 μm to about 2 μm.

At least one of a surface 211 of the first printing layer 210 and a surface 221 of the second printing layer 220 may be about 0.6 μm or less. The surface roughness in at least one of the surface 211 of the first printing layer 210 and the surface 221 of the second printing layer 220 may be in the range of about 0.4 μm to about 0.6 μm.

In addition, at least one of the first and second printing layers 210 and 220 may have the straightness of about ±10 μm or less. In detail, at least one of the first and second printing layers 210 and 220 may have the straightness in the range of about ±0.1 μm to about ±10 μm. In detail, at least one of the first and the second printing layers 210 and 220 may have the straightness in the range of about ±5 μm to about ±10 μm.

The wire electrode 400 may be provided on the at least one of the first and second printing layers 210 and 220, and the protective layer 600 may be provided on the at least one of the first and second printing layers 210 and 220 to cover the wire electrode 400.

The touch panel according to the embodiment can reduce the surface roughness of the printing layer. In addition, the straightness of the printing layer can be improved. The surface roughness of the printing layer is reduced to prevent the wire electrode from being cracked or shorted due to the protrusions on the printing layer when the wire electrode is provided on the printing layer.

In addition, the straightness of the printing layer is improved, so that the Bezel area of the touch panel can be reduced, and the display area can be increased. In addition, according to the touch panel of the embodiment, the thickness of the printing layer can be reduced.

When the printing layer is formed, the printing layer may be formed at a thin thickness through a roll coating scheme. In addition, a pin hole, which may be formed in the surface of the printing layer, can be prevented, so that another printing layer may not be additionally formed. Accordingly, the whole thickness of the printing layer can be reduced.

When the sensing electrode is connected with the wire electrode on the printing layer, the damage to the sensing electrode, which may occur in the printing layer, can be prevented. In addition, when the cover substrate is bonded to another substrate through an adhesive layer, the gap between the printing layer and the adhesive layer resulting from the step difference of the printing layer can be minimized. The introduction of an air layer infiltrated through the gap can be minimized.

In addition, the printing layer includes a photoresist resin composition to improve the adhesive strength with the cover substrate, so that the printing layer can be prevented from being delaminated from the cover substrate.

According to the touch panel of the embodiment, electrodes such as a sensing electrode and a wire electrode cannot be prevented from being shorted, and the delamination of the printing layer can be prevented, the introduction of air through the gap between the adhesive layer and the printing layer can be minimized, the reliability of the whole touch panel can be improved, and the Bezel area can be reduced, so that the display area can be increased.

A touch panel according to another embodiment will be described with reference to FIGS. 6 to 13. The following description will be made while focusing on the difference from the above-described embodiments, and the structure or the components the same as those of the above-described embodiments will not be further described.

Figure 6:
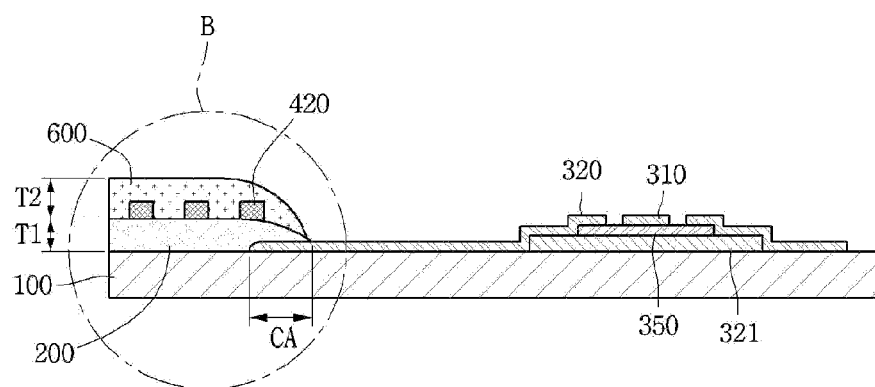
FIG. 6 is a sectional view taken along line A-A' of FIG. 2 according to another embodiment.
Figure 7:
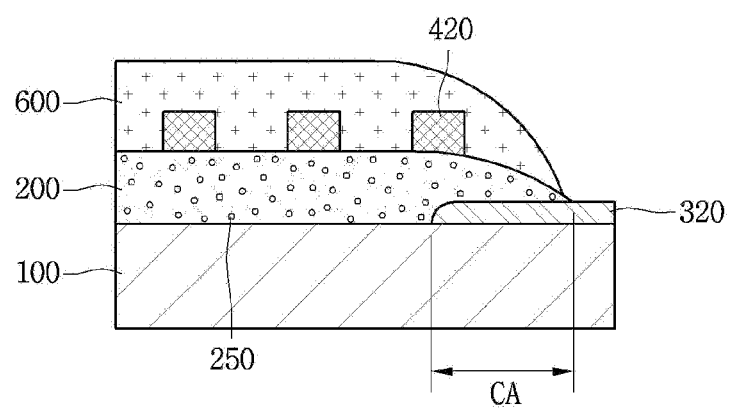
FIGS. 7 to 9 are enlarged views showing an area B of FIG. 6.
Figure 8:
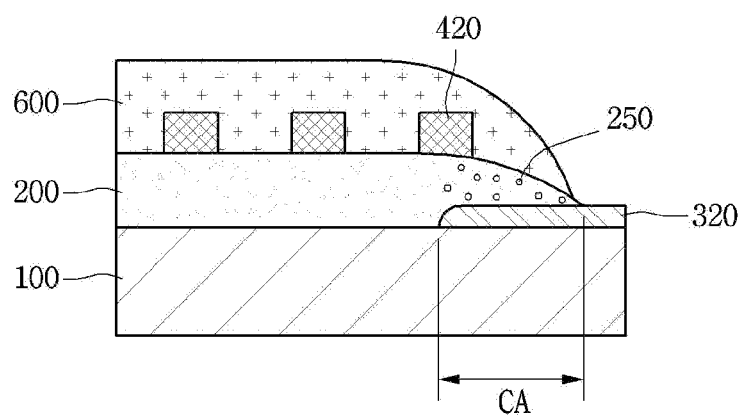
Figure 9:
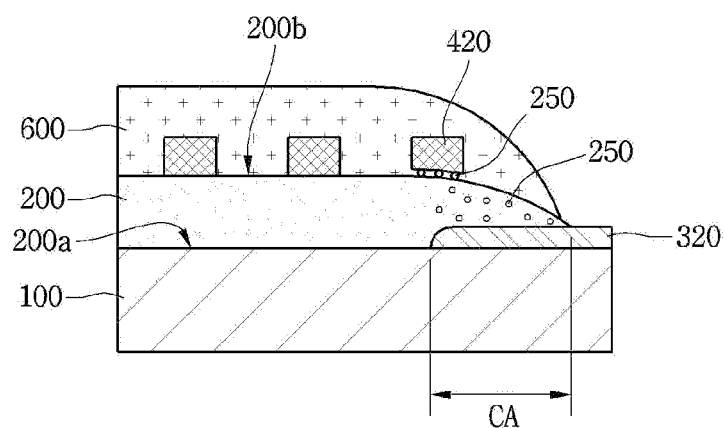

FIG. 6 is a sectional view taken along line A-A' of FIG. 2 according to another embodiment, and FIGS. 7 to 9 are enlarged sectional views of an area B of FIG. 6. Referring to FIGS. 6 to 9, a touch panel according to another embodiment may include a cover substrate 100, a printing layer 200, a sensing electrode 300, a wire electrode 400, and a printing circuit board 500.

The printing layer 200 may be provided in the unactive area UA on the cover substrate 100. The printing layer 200 may partially make contact with the sensing electrode 300. In detail, one end of the sensing electrode 300 extending from the active area AA to the unactive area UA may make contact with the printing layer 200 in the unactive area UA. In other words, the printing layer 200 may cover one end of the sensing electrode 300 provided on the unactive area UA.

The printing layer 200 according to another embodiment may further a conductive member 250 as compared with the printing layer 200 according to previous embodiment. The printing layer 200 may include the conductive member 250 provided on the surface of the printing layer 200 or in the printing layer 200.

The conductive member 250 may include various materials having conductivity. The conductive member 250 may include a conductive ball having a predetermined size. In detail, the conductive member 250 may include a conductive ball having a particle size in the range of about 5 μm to about 10 μm. The conductive member 250 may be positioned in at least one of an outer area and an inner area of the printing layer 200.

The conductive member 250 may be provided at the inner area of the printing layer 200. Referring to FIG. 7, the conductive member 250 may be provided at the whole area of the printing layer 200. In addition, referring to FIG. 8, the conductive member 250 may be provided only in a contact area CA in which the printing layer 200 makes contact with the sensing electrode 300 as the printing layer 200 is overlapped with the sensing electrode 300.

Referring to FIG. 9, the conductive member 250 may be provided in at least one of the inner and outer areas of the printing layer. In detail, the conductive member 250 may be provided in the inner area of the printing layer and on at least one (that is, in an outer area of the printing layer) of one surface 200a, on which the printing layer 200 makes contact with the cover substrate 100, and an opposite surface 200b opposite to the one surface 200a. In addition, the conductive member 250 may be provided in at least one area of the inner area of the printing layer and a contact area CA, in which the printing layer 200 makes contact with the sensing electrode 300 as the printing layer 200 is overlapped with the sensing electrode 300, of the outer area of the printing layer 200 representing the one surface and the opposite surface of the printing layer 200.

The wire electrode 400 may be provided on the unactive area UA of the cover substrate 100. In detail, the wire electrode 400 may be provided on the printing layer 200. The wire electrode 400 may be connected with the sensing electrode 300 and may be provided on the printing layer 200.

The wire electrode 400 may include first and second wire electrodes 410 and 420. In detail, the wire electrode 400 may include the first wire electrode 410 connected with the first sensing electrode 310 and the second wire electrode 420 connected with the second sensing electrode 320.

One end of the first wire electrode 410 and one electrode of the second wire electrode 420 may be connected with the sensing electrode 300, and opposite ends of the first and second wire electrodes 410 and 420 may be connected with the printed circuit board 500.

The wire electrode 400 may include a conductive material. For example, the wire electrode 400 may include a metallic material such as copper (Cu), or silver (Ag), but the embodiment is not limited thereto. The wire electrode 400 may include a transparent conductive material such as indium tin oxide.

According to another embodiment, the wire electrode 400 may be connected with the sensing electrode 300 on the contact area CA in which the printing layer 200 is overlapped with the sensing electrode 300. In detail, the sensing electrode 300 does not directly make contact with the wire electrode 400, but may be indirectly connected with the wire electrode 400 through the conductive member 250 provided on the surface of the printing layer 200 or in the printing layer 200.

The wire electrode 400 receives the sensed touch signal from the sensing electrode 300, and the touch signal may be transmitted to the driving chip 510 mounted on the printed circuit board 500 electrically connected with the wire electrode 400 through the wire electrode 400.

The printed circuit board 500 may be provided on the unactive area UA. The printed circuit board 500 may include a flexible printed circuit board (FPCB). The printed circuit board 500 may be connected with the wire electrode 400 provided on the unactive area UA. In detail, the printed circuit board 500 may be electrically connected with the wire electrode 400 through an anisotropic conductive film (ACF) on the unactive area UA.

The driving chip 510 may be mounted on the printed circuit board 500. In detail, the driving chip 510 receives the touch signal sensed by the sensing electrode 300 from the wire electrode 400 so that the driving chip 510 may perform an operation according to the touch signal.

A passivation layer 600 may be further provided on the printing layer 200. In detail, the passivation layer 600 may be provided on the printing layer 200 to cover the wire electrode 400.

Figure 10:
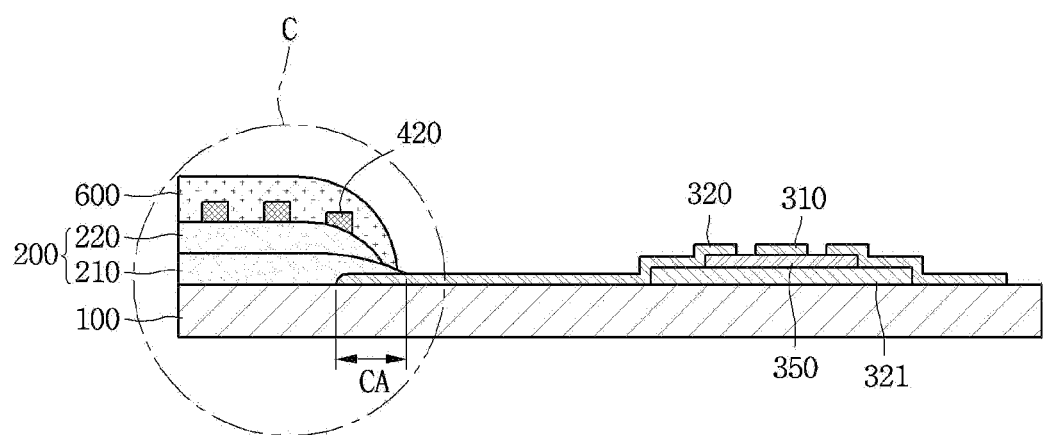
FIG. 10 is a sectional view taken along line A-A' of FIG. 2 according to another embodiment.

FIG. 10 is a sectional view taken along line A-A' of FIG. 2, and FIGS. 11 to 13 are enlarged sectional views showing an area C of FIG. 10. Referring to FIGS. 10 to 13, the printing layer 200 according to another embodiment may include a plurality of printing layers. For example, the printing layer 200 may include first and second printing layers 210 and 220. The first printing layer 210 makes contact with the cover substrate 100, and the second printing layer 220 may make contact with the first printing layer 210.

Although FIG. 10 shows only the first and second printing layers, the embodiment is not limited thereto. The printing layer may include a plurality of printing layers such as a third printing layer on the second printing layer.

The first and second printing layers 210 and 220 may be provided with mutually different widths. Although FIG. 10 shows that the first printing layer 210 has a width wider than that of the second printing layer 220, the embodiment is not limited thereto. The second printing layer 220 may have a width wider than that of the first printing layer 210.

Figure 11:
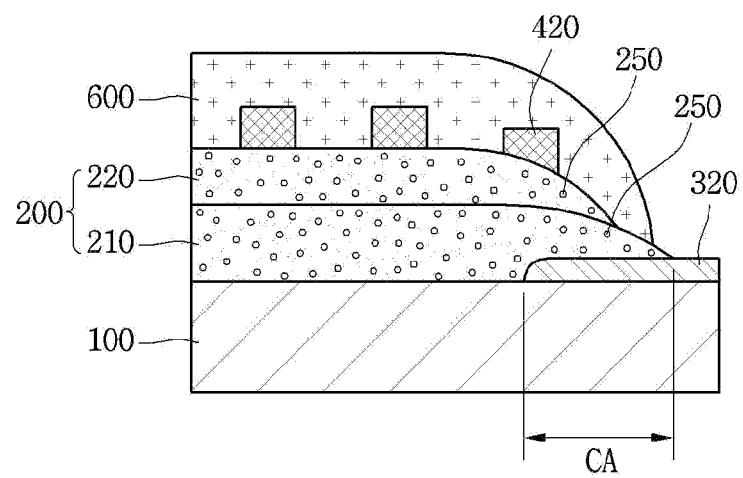
FIGS. 11 to 13 are enlarged views showing an area C of FIG. 10.

The conductive member 250 may be positioned in at least one of an outer area and an inner area of the first printing layer 210 and the second printing layer 220. The conductive member 250 may be provided at the inner area of the printing layer 200. Referring to FIG. 11, the conductive member 250 may be provided at the whole area of the first printing layer 210 and the second printing layer 220. In addition, referring to FIG. 9, the conductive member 250 may be provided only in a contact area CA in which the first printing layer 210 or the second printing layer 220 makes contact with the sensing electrode 300 as the first printing layer 210 or the second printing layer 220 is overlapped with the sensing electrode 300.

Figure 12:
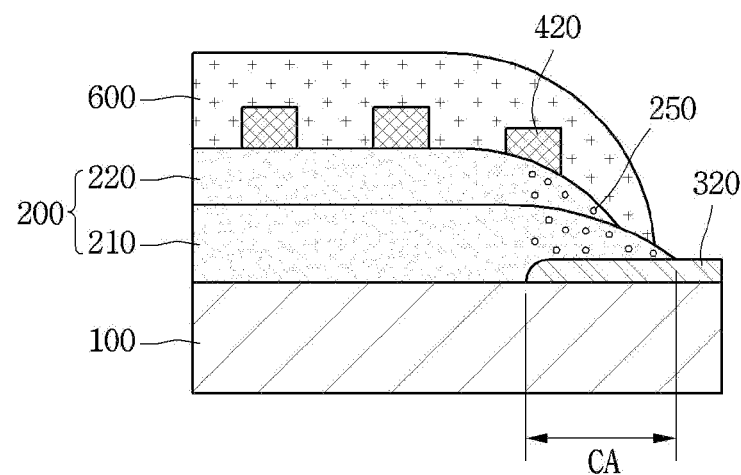
Figure 13:
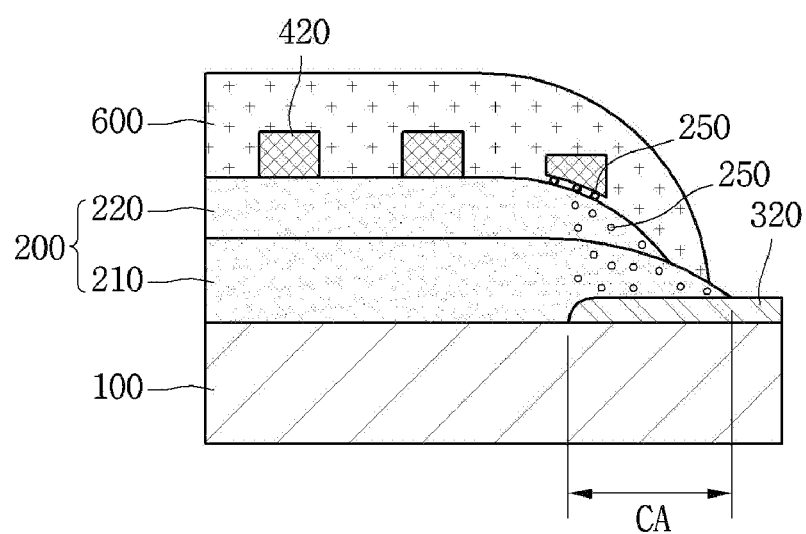

In addition, referring to FIG. 12, the conductive member 250 may be provided in at least one of an outer area and an inner area of a surface of the printing layer 200. In detail, the conductive member 250 may be provided in the inner area of the printing layer and on at least one (that is, in an outer area of the printing layer) of one surface 210a, on which the first printing layer 210 makes contact with the cover substrate 100, and one surface 200b of the second printing layer 220. In addition, the conductive member 250 may be provided in at least one area of the inner area of the printing layer and a contact area CA, in which the first printing layer 210 or the second printing layer 220 makes contact with the sensing electrode 300 as the first printing layer 210 or the second printing layer 220 is overlapped with the sensing electrode 300, of the outer area of the printing layer 200 representing the one surface of the printing layer 210 and the one surface of the printing layer 220.

The wire electrode 400 may be provided on the unactive area UA of the cover substrate 100. In detail, the wire electrode 400 may be provided on at least one of the first printing layer 210 and the second printing layer 220. The wire electrode 400 may be connected with the sensing electrode 300 on the contact area CA in which the first printing layer 210 or the second printing layer 220 is overlapped with the sensing electrode 300. In detail, the sensing electrode 300 does not make direct contact with the wire electrode 400, but may be indirectly connected with the wire electrode 400 by the conductive member 250 provided on the surface or at an inner part of the first printing layer 210 or the second printing layer 220.

The passivation layer 600 may be further provided on the second printing layer 220. In detail, the passivation layer 600 may cover the wire electrode 400 on the second printing layer 220.

Hereinafter, a touch panel according to still another embodiment will be described with reference to FIGS. 14 to 17. The following description will be made while focusing on the difference from the above-described embodiments, and the structure or the components the same as those of the above-described embodiments will not be further described.

Figure 14:
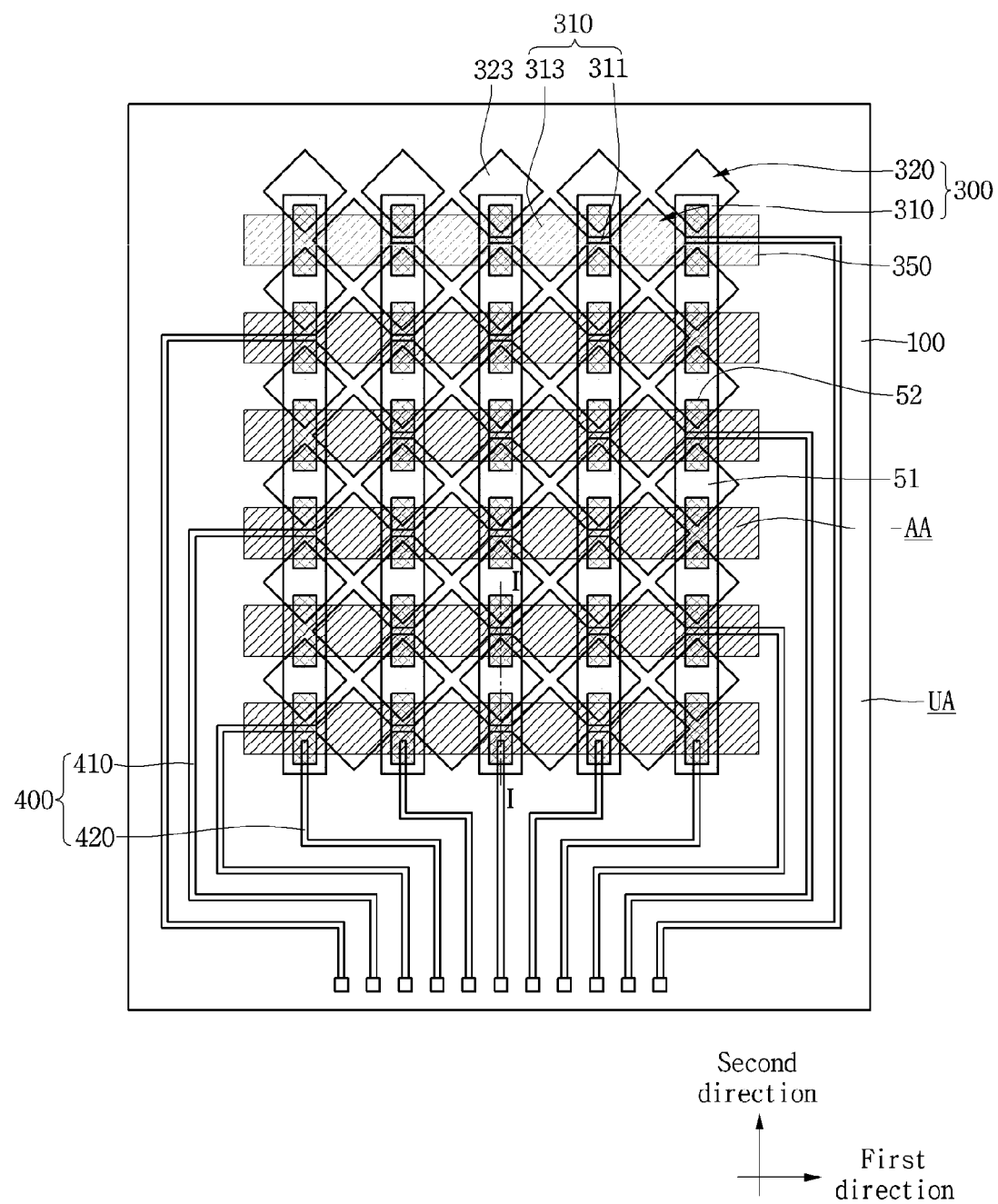
FIG. 14 is a plan view showing a touch panel according to still another embodiment.
Figure 15:
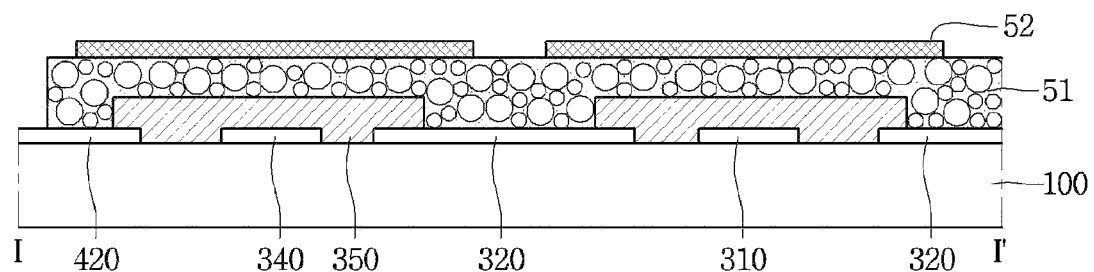
FIG. 15 is a sectional view taken along line I-I' of FIG. 14.
Figure 16:
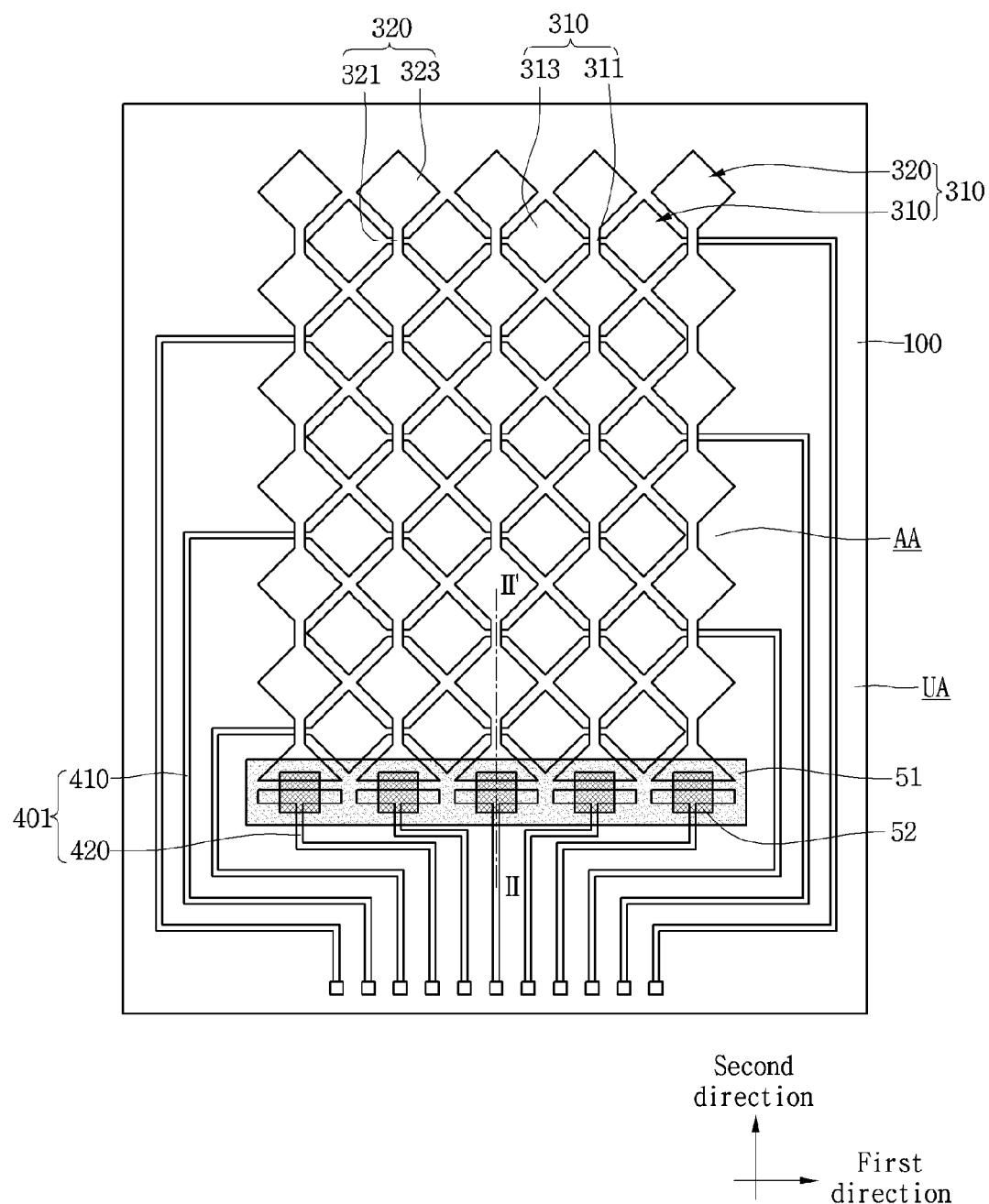
FIG. 16 is a plan view showing the touch panel according to still another embodiment.

FIG. 15 is a sectional view taken along line I-I' of FIG. 14. FIG. 16 is a plan view showing the touch panel according to still another embodiment. Referring to FIGS. 14 and 15, the touch panel according to still another embodiment may include a cover substrate 100, a printing layer 200, a sensing electrode 300, a wire electrode 400, and a printed circuit board 500.

The sensing electrode 300 may include first and second sensing electrodes 310 and 320. The first and second sensing electrodes 310 and 320 may include the same material or materials different from each other. In addition, the first and second sensing electrodes 310 and 320 may be provided on the same surface as that of the cover substrate 100.

The first and second sensing electrodes 310 and 320 may serve as sensors provided on the active area AA to sense the touch. In detail, the first sensing electrode 310 may extend in the first direction on the active area AA, and the second sensing electrode 320 may extend in a direction different from the first direction. In this case, the first and second directions may be perpendicular to each other.

The first sensing electrode 310 may include a plurality of first electrode parts 313 and first connection electrodes 311. The first electrode parts 313 may extend in the first direction. In this case, the first electrode parts 313 may be electrically connected with each other through the first connection electrode 311. The first electrode parts 313 and the first connection electrode 311 may be formed integrally with each other.

Although drawings show that the first electrode part 313 is provided in a diamond shape, the embodiment is not limited thereto. The first electrode part 313 may be provided in various shapes, such as a bar shape, a polygonal shape including a triangular shape or a rectangular shape, a circular shape, a linear H shape, or an oval shape.

The first sensing electrode 310 may be connected with the first wire electrode 410 formed in the unactive area UA. In this case, the first sensing electrode 310 and the first wire electrode 410 may be formed integrally with each other. The second sensing electrode 320 may include a plurality of second electrode parts 323. The second electrode parts 323 may extend in the second direction.

Although drawings show that the second electrode part 323 is provided in a diamond shape, the embodiment is not limited thereto. The second electrode 323 may be provided in various shapes, such as a bar shape, a polygonal shape including a triangular shape or a rectangular shape, a circular shape, a linear H shape, or an oval shape.

The second sensing electrode 320 may include the second electrode parts 323 connected with each other in the second direction. The second electrode parts 323 may be electrically connected with each other through a connection conductive layer. In addition, the second sensing electrode 320 may be connected with the second wire electrode 420 formed in the unactive area UA. In this case, the second sensing electrode 320 and the second wire electrode 420 may be spaced apart from each other. The second sensing electrode 320 may be electrically connected with the second wire electrode 420 through the connection conductive layer.

The connection conductive layer may include first and second connection conductive layers 51 and 52. The connection conductive layer including the first and second connection conductive layers 51 and 52 may be formed on the insulating layer 350. In this case, a portion of the first connection conductive layer 51 may include a printing layer including a conductive member according to the embodiment described above. In detail, a portion of the first connection conductive layer 51 to electrically connect the second sensing electrode 320 with the second wire electrode 420 may include a printing layer including a conductive member.

The insulating layer 350 may be formed on the first sensing electrode 310 to expose the second electrode part 323 of the second sensing electrode 320. The first connection conductive layer 51 may make contact with the second electrode part 323 of the second sensing electrode 320 exposed by the insulating layer 350. In addition, the second connection conductive layer 52 is provided on the first connection conductive layer 51. In other words, the first and second connection conductive layers 51 and 52 may be arranged so that the second electrode parts 323 spaced apart from each other may be connected with each other in the second direction.

The insulating layer 350 may be also formed to expose the second wire electrode 420. The first connection conductive layer 51 may make contact with the second electrode part 323 of the second sensing electrode 320 and the second wire electrode 420 which are exposed by the insulating layer 350. In addition, the second connection conductive layer 52 is provided on the first connection conductive layer 51. In other words, the first and second connection conductive layers 51 and 52 may be provided to connect the second electrode part 323 and the second wire electrode 420, which are spaced apart from each other, with each other.

The insulating layer 350 may be provided on top surfaces of the first electrode part 313 of the first sensing electrode 310 and the first connection electrode 311. In detail, the insulating layer 350 may make contact with the top surfaces of the first electrode part 313 and the first connection electrode 311. In this case, the insulating layer 350 may extend in the first direction on the first electrode part 313 and the first connection electrode 311.

The shape of the insulating layer 350 is not limited to that shown in drawings. In other words, the insulating layer 350 may have various shapes if the first sensing electrode 310 does not make contact with the connection conductive layer. In addition, the insulating layer 350 may have various shapes if the second sensing electrode 320 or the second wire electrode 420 does not make contact with the connection conductive layer. For example, the insulating layer 350 may include a contact hole formed on the first and second sensing electrodes 310 and 320 to expose the second sensing electrode 320. In addition, the insulating layer 350 may be formed only at an intersection area between the first and second sensing electrodes 310 and 320, and may be arranged in multiple bar shapes.

The first and second connection conductive layers 51 and 52 may be electrically connected with the second sensing electrode 320 or the second wire electrode 420. In addition, the first connection conductive layer 51 and the second connection conductive layer 52 may be insulated from the first sensing electrode 310 by the insulating layer 350.

The first connection conductive layer 51 may be a vertical conductive layer. In other words, the first connection conductive layer 51 may be conducted in a vertical direction. The vertical direction of the first connection conductive layer 51 may refer to a vertical direction to all of the first and second directions. For example, conduction may occur between top and bottom surfaces of the first connection conductive layer 51.

The first connection conductive layer 51 may be an anisotropic conductive film. In this case, the first connection conductive layer 51 may have a plurality of conductive balls distributed therein. The first connection conductive layer 51 may represent conductivity in the vertical direction and may represent an insulating property in a horizontal direction through a heating process or a pressurizing process under a predetermined condition. In other words, vertical-directional conduction is possible in an area in which heat or pressure is applied to the first connection conductive layer 51.

The second connection conductive layer 52 may include a horizontal conductive layer. In other words, the second connection conductive layer 52 allows the conduction in the horizontal direction. In other words, the first connection conductive layer 51 may represent conductivity only in the vertical direction, and the second connection conductive layer 52 may represent conductivity in the horizontal direction.

The second connection conductive layer 52 may include a material having superior electric conductivity. For example, the second connection conductive layer 52 may include any one selected from the group consisting of metal, a nanowire, a photosensitive nanowire film, a carbon nano tube (CNT), graphene, and the combination thereof. In addition, the second connection conductive layer 52 includes metal and may be provided in a mesh shape. For example, the second connection conductive layer 52 may include Cu, Au, Ag, Al, Ti, Ni or the alloy thereof.

The first connection conductive layer 51 may be formed on the insulating layer 350. In this case, the first connection conductive layer 51 makes contact with the second sensing electrode 320 or the second wire electrode 420. In this case, the first connection conductive layer 51 may be arranged to extend in the second direction, but the embodiment is not limited thereto. The first connection conductive layer 51 may be arranged through various schemes sufficient to bring the first connection conductive layer 51 into contact with the second sensing electrode 320 or the second wire electrode 420.

The second connection conductive layer 52 may be formed on the first connection conductive layer 51. In this case, the second connection conductive layer 52 may be overlapped with the second sensing electrode 320 or the second wire electrode 420 while interposing the first connection conductive layer 51 between the second connection conductive layer 52 and the second sensing electrode 320 or the second wire electrode 420.

One end of the second connection conductive layer 52 may be overlapped with one electrode part of the second sensing electrode 320, and an opposite end of the second connection conductive layer 52 may be overlapped with another electrode part of the second sensing electrode 320. In addition, the one end of the second connection conductive layer 52 may be overlapped with the second sensing electrode 320, and the opposite end of the second connection conductive layer 52 may be overlapped with the second wire electrode 420.

The first connection conductive layer 51 is conducted in the vertical direction at an area in which the second connection conductive layer 52 is overlapped with the second sensing electrode 320 or the second wire electrode 420, so that the second connection conductive layer 52 may be electrically connected with the second sensing electrode 320 or the second wire electrode 420.

In detail, the second connection conductive layer 52 is overlapped with one second electrode part 323 and another second electrode part 323 adjacent to the one second electrode 323 while interposing the first connection conductive layer 51 between the second connection conductive layer 52 and the one second electrode part 323 and between the second connection conductive layer 52 and the another second electrode part 323. The first connection conductive layer 51 may be conducted in the vertical direction through the heating process or the pressurizing process. Accordingly, the one second electrode part 323 is electrically connected with the second connection conductive layer 52 through the first connection conductive layer 51. In addition, the one second electrode part 323 and the second connection conductive layer 52 are electrically connected with each other through the first connection conductive layer 51.

In addition, as the second connection conductive layer 52 is conducted in the horizontal direction, one second electrode part 323 may be electrically connected with another second electrode part 323. In addition, the second sensing electrode 320 and the second wire electrode 420 are conducted in the vertical direction through the first connection conductive layer 51 and conducted in the horizontal direction through the second connection conductive layer 52, so that the second sensing electrode 320 and the second wire electrode 420 may be electrically connected with each other.

Hereinafter, a method of fabricating the touch panel according to still another embodiment will be described. The first sensing electrode 310 including the first electrode part 313 and the first connection electrode 311, the second sensing electrode 320 including the second electrode part 323, the first wire electrode 410 formed integrally with the first sensing electrode 310, and the second wire electrode 420 are formed on the cover substrate 100 having the active area AA and the unactive area UA. The insulating layer 350 is formed on the first and second sensing electrodes 310 and 320 to expose a portion of the second sensing electrode 320 or the second wire electrode 420.

The first connection conductive layer 51 is formed on the insulating layer 350 to make contact with the second sensing electrode 320 or the second wire electrode 420 that is exposed. The second connection conductive layer 52 is formed on the first connection conductive layer 51. In this case, the second connection conductive layer 52 may be overlapped with the second sensing electrode 320 or the second wire electrode 420 while interposing the first connection conductive layer 51 between the second connection conductive layer 52 and the second sensing electrode 320 or the second wire electrode 420.

Thereafter, the first connection conductive layer 51 may be cured and conducted in the vertical direction through the heating process or the pressurizing process. In addition, the second connection conductive layer 52 may be conducted in the horizontal direction. Accordingly, the second electrode parts 323 of the second sensing electrode 320 may be electrically connected with each other, and the second sensing electrode 320 and the second wire electrode 420 may be electrically connected with each other.

The method of fabricating the touch panel according to still another embodiment is not limited thereto. In other words, the touch panel may be fabricated through various methods if vertical-direction conduction is formed through the first connection conductive layer 51, and the horizontal-direction conduction is formed through the second connection conductive layer 52, so that the second electrode parts 323 of the second sensing electrode 320 are electrically connected with each other, and the second sensing electrode 320 may be electrically connected with the second wire electrode 420.

Alternatively, the second sensing electrode 320 may be connected with the second wire electrode 420 through a printing process. For example, the second sensing electrode 320 may be electrically connected with the second wire electrode 420 through a printing process using Ag paste. In this case, when the printing process is performed using Ag paste, the entire surface of the cover substrate 100 may be heated. Accordingly, the cover substrate 100 may be deformed. In particular, the cover substrate 100 including a material, such as PET, weak against the thermal deformation may have a limitation in heating temperature.

According to another embodiment, only the first connection conductive layer 51 interposed between the second connection conductive layer 52 and the second sensing electrode 320, and between the second connection conductive layer 52 and the second wire electrode 420 is heated or pressurized. In other words, the entire surface of the cover substrate 100 need not be heated or pressurized. In detail, the cover substrate 100 is partially heated or pressurized, so that the deformation of the cover substrate 100 can be prevented or minimized.

In addition, according to still another embodiment, the alignment margin of the first connection conductive layer 51 or the second connection conductive layer 52 may be ensured. The first connection conductive layer 51 is conducted at the area, in which heat or pressure is applied, in the vertical direction, and insulated in the horizontal direction. Accordingly, even if the first connection conductive layer 51 makes contact with the first sensing electrode 310, the first and second sensing electrodes 310 and 320, which must be spaced apart from each other, may be electrically connected with each other.

Although not shown, the touch panel according to still another embodiment may further include a cover substrate provided on the cover substrate 100 having the sensing electrode 300 and the wire electrode 400. In other words, the cover substrate may be provided on the cover substrate 100 having the first sensing electrode 310, the second sensing electrode 320, the first wire electrode 410, and the second wire electrode 420.

A transparent adhesive layer may be formed between the cover substrate 100 and the cover substrate. For example, the transparent adhesive layer may include an optically clear adhesive (OCA) or an optically clear resin (OCR).

Figure 17:
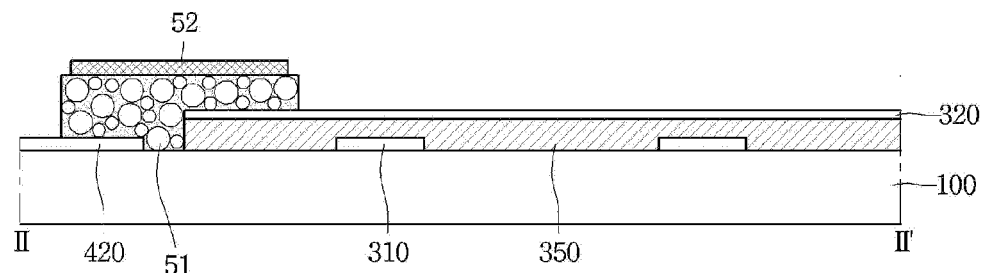
FIG. 17 is a sectional view taken along line II-II' of FIG. 16.

FIG. 16 is a plan view showing the touch panel according to still another embodiment, and FIG. 17 is a sectional view taken along line II-II' of FIG. 16. The touch panel according to still another embodiment may include the cover substrate 100, the printing layer 200, the sensing electrode 300, the wire electrode 400, and the printed circuit board 500.

The sensing electrode 300 may include first and second sensing electrodes 310 and 320. The first and second sensing electrodes 310 and 320 may include the same material or materials different from each other. In addition, the first and second sensing electrodes 310 and 320 may be provided on the same surface as that of the cover substrate 100.

The first and second sensing electrodes 310 and 320 may serve as sensors provided on the active area AA to sense the touch. In detail, the first sensing electrode 310 may extend in the first direction on the active area AA, and the second sensing electrode 320 may extend in a direction different from the first direction. In this case, the first and second directions may be perpendicular to each other.

The first sensing electrode 310 may include a plurality of first electrode parts 313 and first connection electrodes 311. The first electrode parts 313 may extend in the first direction. In this case, the first electrode parts 313 may be electrically connected with each other through the first connection electrode 311. The first electrode parts 313 and the first connection electrode 311 may be formed integrally with each other.

In addition, the second sensing electrode 320 may include a plurality of second electrode parts 323 and the second connection electrode 321. The second electrode parts 323 may extend in the second direction. In this case, the second electrode parts 323 may be electrically connected with each other through the second connection electrode 321. The second electrode part 323 and the second connection electrode 321 may be formed integrally with each other.

Although drawings show that the first electrode part 313 and the second electrode part 323 are provided in a diamond shape, the embodiment is not limited thereto. The first electrode part 313 and the second electrode part 323 may be provided in various shapes, such as a bar shape, a polygonal shape including a triangular shape or a rectangular shape, a circular shape, a linear H shape, or an oval shape.

The insulating layer 350 may be interposed between the first and second sensing electrodes 310 and 320. In detail, the first sensing electrode 310 may be formed on the cover substrate 100, the insulating layer 350 may be formed on the first sensing electrode 310, and the second sensing electrode 320 may be formed on the insulating layer 350.

The insulating layer 350 may be formed on the entire surface of the cover substrate 100 having the first sensing electrode 310. In addition, the insulating layer 350 may be formed on the active area AA of the cover substrate 100. In addition, the insulating layer 350 may be formed only at a lower portion of the second sensing electrode 320. In other words, the insulating layer 350 may have various shapes sufficient to electrically insulate the first sensing electrode 310 from the second sensing electrode 320.

The wire electrode 400 formed on the unactive area UA of the cover substrate 100 may apply an electrical signal to the sensing electrode 300. The wire electrode 400 may include the first and second wire electrodes 410 and 420. The wire electrode 400 may be formed on the unactive area UA so that the wire electrode 400 is not viewed.

The wire electrode 400 may include a material the same as, or different from that of the sensing electrode 300 formed on the active area AA. The wire electrode 400 may include a conductive material. The wire electrode 400 may include a transparent conductive material, metal, or conductive polymer. In addition, the wire electrode 400 may be formed in the same process as or a process different from that of the sensing electrode 300.

The first wire electrode 410 formed on the unactive area UA is electrically connected with the first sensing electrode 310 formed on the active area AA. The first wire electrode 410 and the first sensing electrode 310 may be formed integrally with each other.

The second wire electrode 420 formed on the unactive area UA is electrically connected with the second sensing electrode 320 formed on the active area AA. The second wire electrode 420 may be formed on the same layer as that of the first sensing electrode 310 and the first wire electrode 410. In this case, the second wire electrode 420 may be spaced apart from the second sensing electrode 320. The second wire electrode 420 may be electrically connected with the second sensing electrode 320 formed on the insulating layer 350 through the connection conductive layer.

The connection conductive layer may include the first and second connection conductive layers 51 and 52. The connection conductive layer including the first and second connection conductive layers 51 and 52 is formed on the second sensing electrode 320 and the second wire electrode 420. In this case, the first connection conductive layer 51 may be a printing layer including a conductive member according to the above-described embodiment.

The first connection conductive layer 51 is formed to make contact with the second sensing electrode 320 and the second wire electrode 420 formed on the insulating layer 350. In this case, the first connection conductive layer 51 may be formed to be overlapped with the second electrode part 323 of the second sensing electrode 320 and the second wire electrode 420. The second connection conductive layer 52 is formed on the first connection conductive layer 51. In other words, the first and second connection conductive layers 51 and 52 may be arranged to connect the second sensing electrode 320 and the second wire electrode 420 spaced apart from each other.

In this case, the insulating layer 350 may be spaced apart from the second wire electrode 420. In addition, the insulating layer 350 may be formed to expose a portion of the second wire electrode 420. In other words, the insulating layer 350 may be interposed between the first and second sensing electrodes 310 and 320 to expose the second wire electrode 420.

The first connection conductive layer 51 and the second connection conductive layer 52 may be electrically connected with the second sensing electrode 320 or the second wire electrode 420. In addition, the first and second connection conductive layers 51 and 52 may be insulated from the first sensing electrode 310 by the insulating layer 350.

The first connection conductive layer 51 may be a vertical conductive layer. In other words, the first connection conductive layer 51 may be conducted in the vertical direction. The vertical direction of the first connection conductive layer 51 may refer to a vertical direction to all of the first and second directions. For example, conduction may occur between top and bottom surfaces of the first connection conductive layer 51. In addition, the first connection conductive layer 51 may be conducted in the vertical direction, and may be insulated in the horizontal direction.

The first connection conductive layer 51 may be an anisotropic conductive film. In this case, the first connection conductive layer 51 may have a plurality of conductive balls distributed therein. The first connection conductive layer 51 may represent conductivity in the vertical direction and may represent an insulating property in a horizontal direction through a heating process or a pressurizing process under a predetermined condition. In other words, vertical-directional conduction is possible in an area in which heat or pressure is applied to the first connection conductive layer 51.

The second connection conductive layer 52 may include a horizontal conductive layer. In other words, the second connection conductive layer 52 allows the conduction in the horizontal direction. In other words, the first connection conductive layer 51 may represent conductivity only in the vertical direction, and the second connection conductive layer 52 may represent conductivity in the horizontal direction.

The second connection conductive layer 52 may include a material having superior electric conductivity. For example, the second connection conductive layer 52 may include any one selected from the group consisting of metal, a nanowire, a photosensitive nanowire film, a carbon nano tube (CNT), graphene, and the combination thereof. In addition, the second connection conductive layer 52 includes metal and may be provided in a mesh shape. For example, the second connection conductive layer 52 may include Cu, Au, Ag, Al, Ti, Ni or the alloy thereof.

The first connection conductive layer 51 is formed at an area, in which the second sensing electrode 320 and the second wire electrode 420 are adjacent to each other, to make contact with the second sensing electrode 320 and the second wire electrode 420. In this case, the first connection conductive layer 51 may be arranged to extend in the first direction, but the embodiment is not limited thereto. The first connection conductive layer 51 may be arranged through various schemes sufficient to bring the first connection conductive layer 51 into contact with the second sensing electrode 320 and the second wire electrode 420. For example, the first connection conductive layer 51 may be arranged in the shape of a plurality of bars.

The second connection conductive layer 52 may be formed on the first connection conductive layer 51. In this case, the second connection conductive layer 52 is overlapped with the second sensing electrode 320 and the second wire electrode 420 while interposing the first connection conductive layer 51 between the second connection conductive layer 52 and the second sensing electrode 320 and between the second connection conductive layer 52 and the second wire electrode 420. In addition, one end of the second connection conductive layer 52 may be overlapped with the second sensing electrode 320, and an opposite end of the second connection conductive layer 52 may be overlapped with the second wire electrode 420.

The first connection conductive layer 51 is conducted in the vertical direction at an area, in which the second connection conductive layer 52 is overlapped with the second sensing electrode 320 and the second wire electrode 420, so that the second connection conductive layer 52 may be electrically connected with the second sensing electrode 320 and the second wire electrode 420.

In detail, the second connection conductive layer 52 is overlapped with the second sensing electrode 320 and the second wire electrode 420 while interposing the first connection conductive layer 51 between the second connection conductive layer 52 and the second sensing electrode 320 and between the second connection conductive layer 52 and the second wire electrode 420. The first connection conductive layer 51 may be conducted in the vertical direction through a heating process or a pressurizing process.

Accordingly, the second sensing electrode 320 is electrically connected with the second connection conductive layer 52 through the first connection conductive layer 51. In addition, the second wire electrode 420 is electrically connected with the second connection conductive layer 52 through the first connection conductive layer 51. As the second connection conductive layer 52 is conducted in the horizontal direction, the second sensing electrode 320 and the second wire electrode 420 may be electrically connected with each other.

According to still another embodiment, only the first connection conductive layer 51 interposed between the second connection conductive layer 52 and the second sensing electrode 320, and between the second connection conductive layer 52 and the second wire electrode 420 is heated or pressurized. In other words, the entire surface of the cover substrate 100 need not be heated or pressurized. In detail, the cover substrate 100 is partially heated or pressurized, so that the deformation of the cover substrate 100 can be prevented or minimized.

In addition, according to still another embodiment, the second sensing electrode 320 is formed on the insulating layer 350, so that an additional connection conductive layer is not required in the active area AA. Accordingly, the connection conductive layer, which is required when the first and second sensing electrodes 310 and 320 are formed at the same layer, may be omitted. Therefore, the failure caused by the miss align of the connection conductive layer can be prevented.

Although not shown, the touch panel according to the embodiment may further include a cover substrate provided on the cover substrate 100 having the sensing electrode 300 and the wire electrode 400. In other words, the cover substrate may be provided on the cover substrate 100 having the first sensing electrode 310, the second sensing electrode 320, the first wire electrode 410, and the second wire electrode 420.

A transparent adhesive layer may be formed between the cover substrate 100 and the cover substrate. For example, the transparent adhesive layer may include an optically clear adhesive (OCA) or an optically clear resin (OCR).

Figure 18:
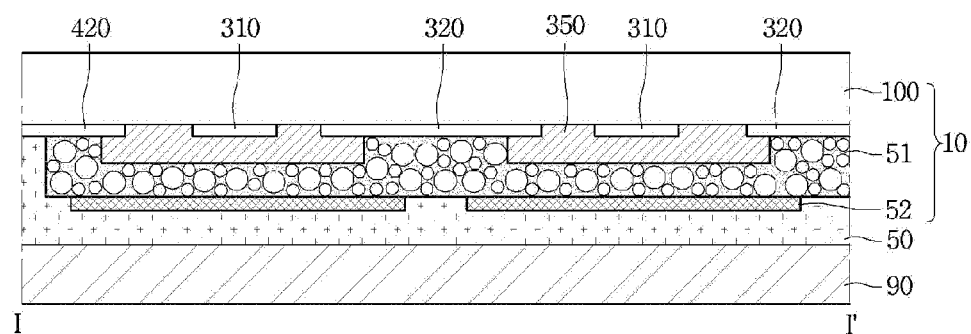
FIGS. 18 and 19 are sectional views showing a touch device employing the touch panel according to the embodiment.
Figure 19:
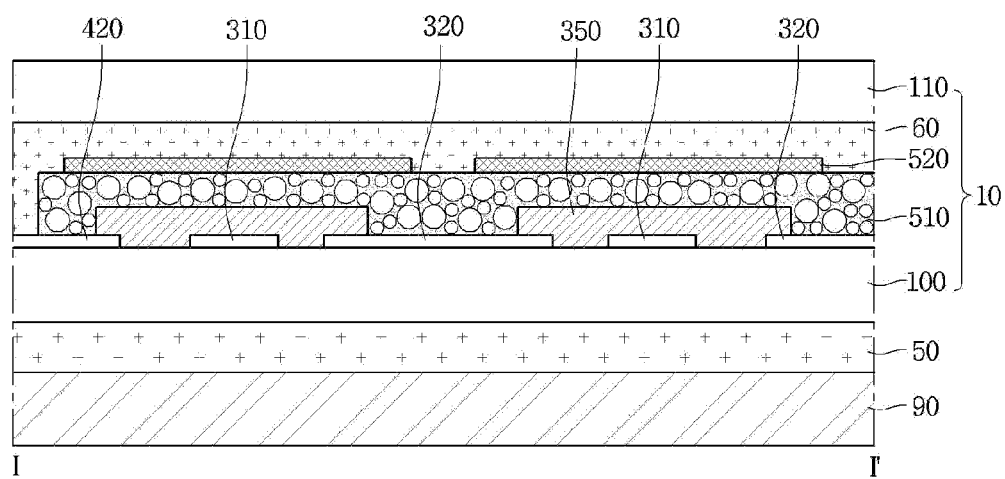

FIGS. 18 and 19 are sectional views showing a touch device including a touch panel according to the embodiment. The touch device including the touch panel according to the embodiment includes a display panel 90 and a touch panel 10. The touch panel 10 is the same as those of the above-described embodiments.

The touch device may include an active area to transmit light and an unactive area not to transmit light. An adhesive layer is interposed between the display panel 90 and the touch panel 10. The adhesive layer 50 may be formed at portions of the active area and the unactive area. The adhesive layer 50 may employ an OCA or an OCR to bond the display panel 90 to the touch panel 10.

Referring to FIG. 18, the cover substrate 100 including the first and second sensing electrodes 310 and 320 may serve as a cover substrate of the touch panel 10. In this case, the adhesive layer 50 may make contact with the first and second sensing electrodes 310 and 320 formed on the cover substrate 100.

Referring to FIG. 19, the touch panel 10 may include an additional passivation layer 600. In this case, a transparent adhesive layer 60 may be interposed between the passivation layer 600 and the cover substrate 100. In addition, the adhesive layer 50 may make contact with a rear surface of the cover substrate 100.

The display panel 90 may include a liquid crystal display panel and a backlight unit serving as a surface light source for the liquid crystal display panel. The liquid crystal panel and the backlight unit may be integrally coupled to each other by a set cover. For example, the set cover may include a lower cover and a support main and upper cover. In this case, the upper cover, and the support main and lower cover are integrally assembled with each other, and a cover attachment film is bonded to the upper cover and the touch panel, so that the touch panel can be formed integrally with each other the upper cover.

The liquid crystal panel has a structure in which an upper substrate including RGB color filters is combined with a lower substrate including a thin film transistor (TFT) and a pixel electrode while interposing the liquid crystal layer between the upper substrate and the lower substrate.

In addition, the liquid crystal display panel has a color filter on transistor (COT) structure in which a color filter and a black matrix are formed on the lower substrate. The TFT may be formed on the lower substrate, a protective layer may be formed on the TFT, and the color filter layer may be formed on the protective layer. In addition, a pixel electrode is formed on the lower substrate while making contact with the thin film transistor. In order to improve an aperture ratio and simplify a mask process, the black matrix may be omitted, and the common electrode may perform the function of the black matrix.

The backlight unit may include a light emitting diode package (light emitting package) including red (R), green (G), and blue (B) light emitting diodes (LED) or white (W) light emitting diodes, a printed circuit board having a plurality of power patterns to supply power to the light emitting package, a light guide plate to convert light supplied from the light emitting package in the form of a surface light source, a reflective plate provided on a rear surface of the light guide plate to improve light efficiency, and an optical sheet provided at a front (on) of the light guide plate to collect and diffuse light.

The display panel 90 is an organic light emitting display panel. The organic light emitting display panel includes a self light-emitting device which does not require any additional light source. The organic light emitting display panel includes a thin film transistor formed on a substrate and an organic light emitting device making contact with the thin film transistor. The organic light emitting device may include an anode, a cathode, and an organic light emitting layer interposed between the anode and the cathode. In addition, the organic light emitting display panel may further include an encapsulation substrate formed on the organic light emitting device for encapsulation.

In addition, the display panel 90 is not limited thereto, and may include an electrophoretic display (EPD), an electric paper display, a plasma display panel device (PDP), a field emission display device (FED), an electro-luminescence display device (ELD), and an electro-wetting display (EWD).

Figure 20:
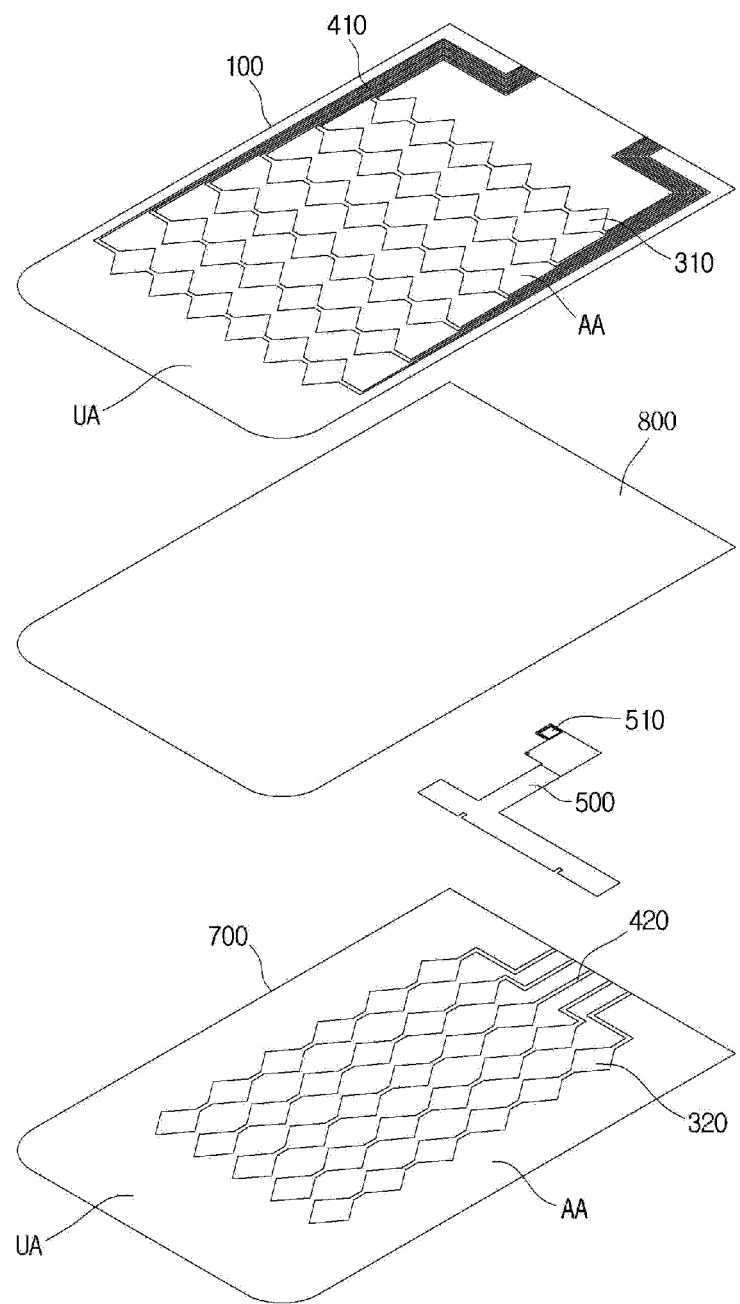
FIG. 20 is a perspective view showing another example of the touch panel according to the embodiment.

FIG. 20 is a perspective view showing another example of the touch panel according to the embodiment. A substrate 700 may be further provided on a cover substrate 100, and a sensing electrode 300 and a wire electrode 400 may be provided on one surface of the cover substrate 100 and on one surface of a substrate 700, respectively. The substrate 700 may include plastic such as polyethylene terephthalate (PET).

The cover substrate 100 may be bonded to the substrate 700 through an adhesive layer 800. For example, the cover substrate 100 and the substrate 700 may be bonded to each other through an OCA 800. In other words, a first sensing electrode 310 and a first wire electrode 410 may be provided on one surface of the cover substrate 100, and a second sensing electrode 320 and a second wire electrode 420 may be provided on one surface of the substrate 700. Since a printing layer, a wire electrode, and a protective layer have the same description as that of the above-described embodiments, the details thereof will be omitted.

Figure 21:
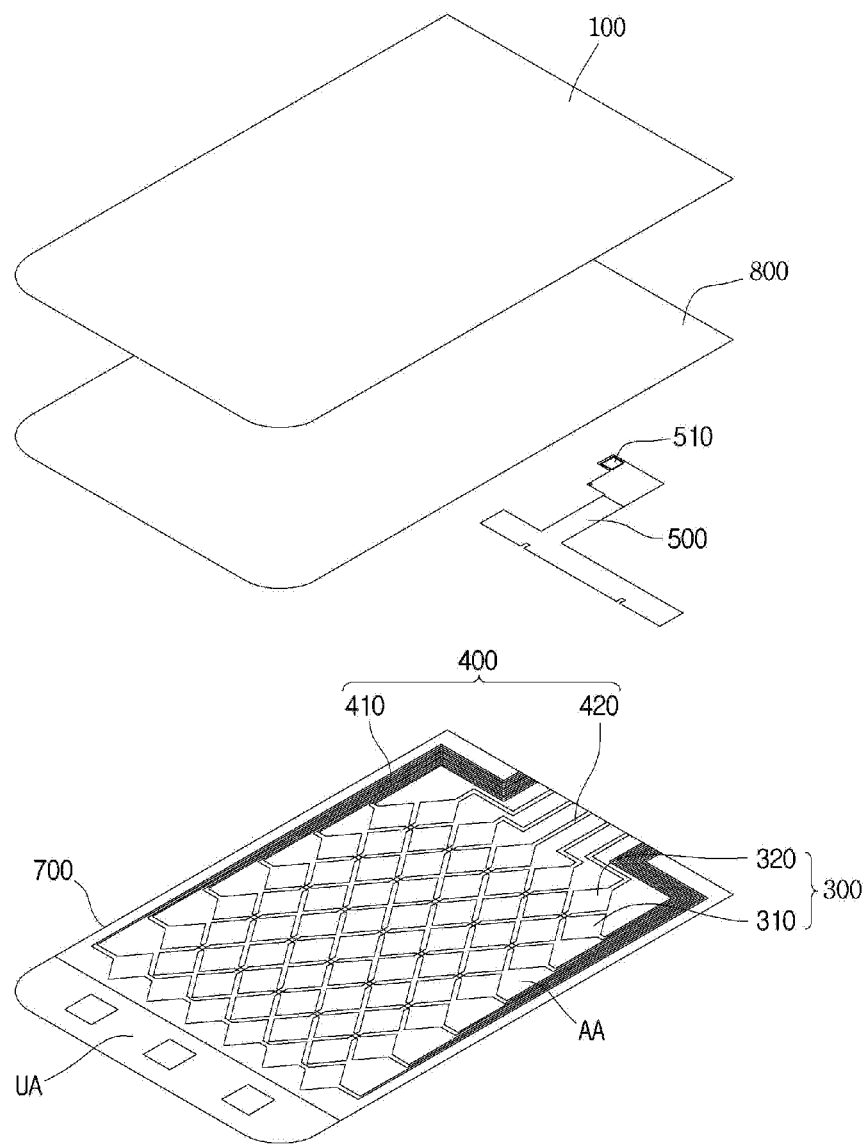
FIGS. 21 and 22 are perspective views showing other examples of a touch panel according to the embodiment.
Figure 22:
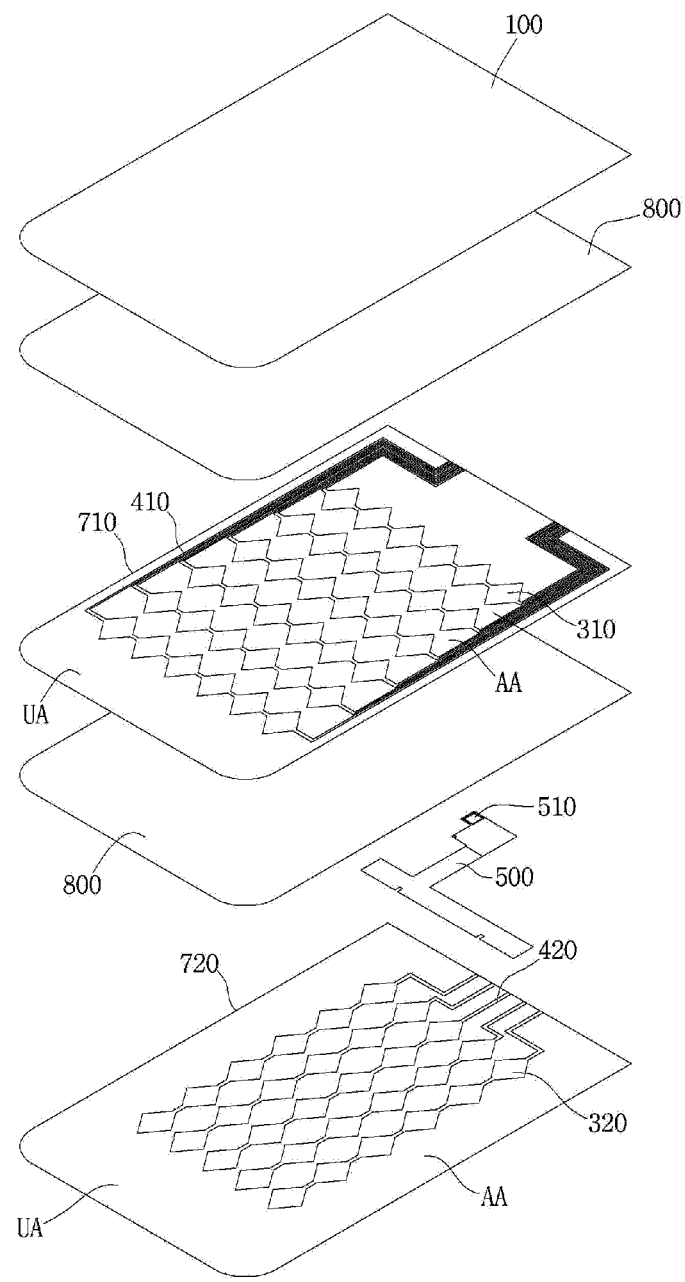

FIGS. 21 and 22 are perspective views showing other examples of a touch panel according to the embodiment. Referring to FIG. 21, a substrate 700 may be further provided on a cover substrate 100, and the sensing electrode 300 and the wire electrode 400 may be provided on one surface of the substrate 700 and on an opposite surface of the one surface of the substrate 700. The substrate 700 may include plastic such as polyethylene terephthalate (PET).

The cover substrate 100 may be bonded to the substrate 700 through an adhesive layer 800. For example, the cover substrate 100 and the substrate 700 may be bonded to each other through an OCA 800. In other words, a first sensing electrode 310 and a first wire electrode 410 may be provided on one surface of the cover substrate 100, and a second sensing electrode 320 and a second wire electrode 420 may be provided on one surface of the substrate 700.

In addition, the substrate 700 may be provided on one surface thereof with the first sensing electrode 310, the second sensing electrode 320, the first wire electrode 410, and the second wire electrode 420. In detail, the first sensing electrode 310 and the second sensing electrode 320 may be insulated from each other through an insulating layer as described above. The first and second sensing electrodes 310 and 320 may be provided on the same surface of the substrate 700 without the contact with each other. Since a printing layer, a wire electrode, and a protective layer have the same description as that of the above-described embodiments, the details thereof will be omitted.

Referring to FIG. 22, first and second substrates 710 and 720 may be further provided on the cover substrate 100, and the sensing electrode 300 and the wire electrode 400 may be provided on one surface of the first substrate 710 and one surface of the second substrate 720, respectively. The first substrate 710 and/or the second substrate 720 may include plastic such as PET.

The cover substrate 100, the first substrate 710, and the second substrate 720 may be bonded to each other through the adhesive layer 800. For example, the cover substrate 100 and the substrate 700 may be bonded to each other through an OCA 800.

In other words, the first sensing electrode 310 and the first wire electrode 410 may be provided on one surface of the first substrate 710, and the second sensing electrode 320 and the second wire electrode 420 may be provided on one surface of the second substrate 720.

Since a printing layer, a wire electrode, and a protective layer have the same description as that of the above-described embodiments, the details thereof will be omitted.

Figure 23:
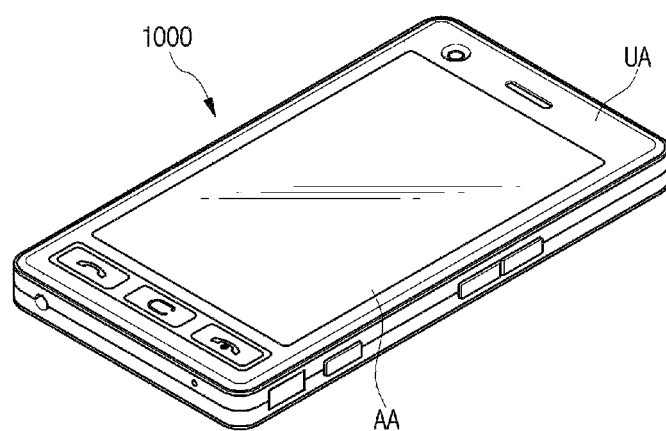
FIGS. 23 to 26 are views showing one example of a touch device.

FIGS. 23 to 26 are views showing one example of a touch device. Referring to FIG. 23, a mobile terminal 1000 may include an active area AA and an unactive area UA. The active area AA may sense a touch signal due to a touch by a finger, and the unactive area UA may be provided therein with an instruction icon pattern part and a logo.

Figure 24:
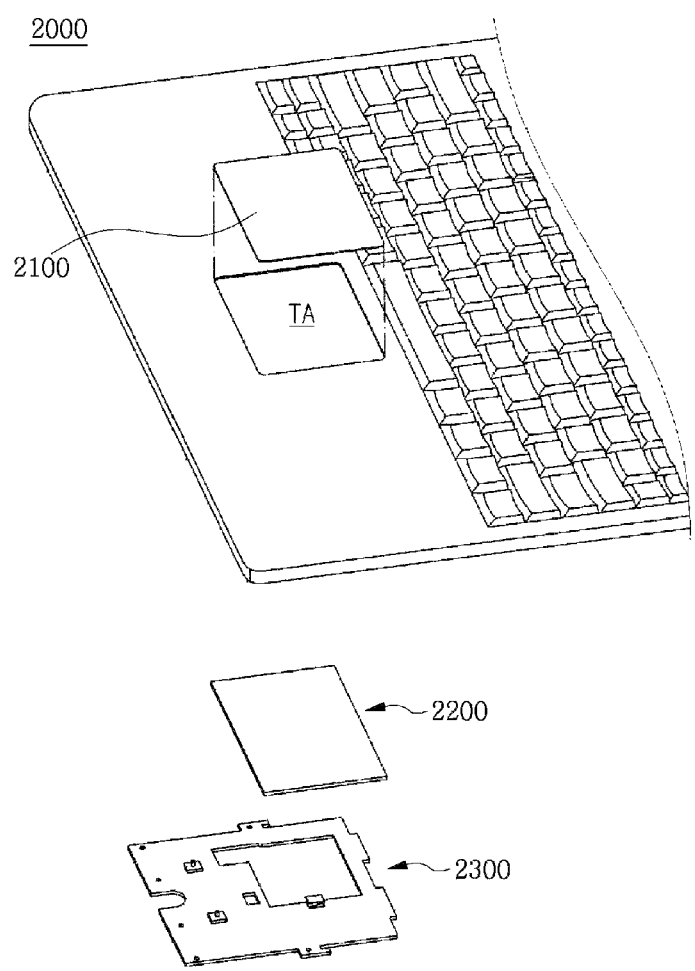

In addition, referring to FIG. 24, a portable laptop computer is shown as one example of a display device. A portable laptop computer 2000 may include a touch panel 2200, a touch sheet 2100, and a circuit board 2300. The touch sheet 2100 is provided on a top surface of the touch panel 2200. The touch sheet 2100 may protect a touch area TA. In addition, the touch sheet 2100 may improve the touch feel of a user. In addition, the circuit board 2300 which is electrically connected with the touch panel 2200 is provided on a bottom surface of the touch panel 2200. The circuit board 2300 is a printed circuit board, and various components to constitute the portable laptop computer may be mounted on the circuit board 2300.

Figure 25:
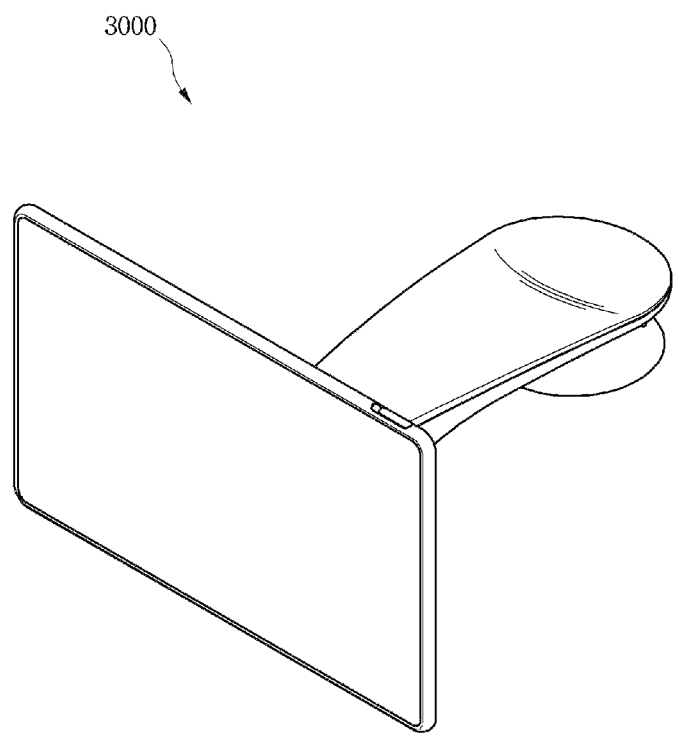
Figure 26:

Referring to FIG. 25, the touch panel may be applied to a vehicle navigation 3000. Referring to FIG. 26, the touch panel may be applied to an interior of a vehicle. In other words, the touch panel may be applied to various components allowing the application of the touch panel. Accordingly, the touch window is applied to a dashboard as well as a PND (Personal Navigation Display) so that a CID (Center Information Display) may be implemented. However, the embodiment is not limited to the embodiment. In other words, the display may be used in various electronic products.

The embodiment provides a touch panel having improved reliability and a small Bezel area.

According to the embodiment, there is provided a touch panel including a cover substrate including an active area and an unactive area, and a printing layer on the unactive area. The printing layer has surface roughness in a range of 0.4 μm to 0.6 μm, and has straightness in a range of ±0.1 μm to ±10 μm.

As described above, according to the touch panel of the embodiment, the surface roughness of the printing layer can be reduced. In addition, the straightness of the printing layer can be improved.

As the surface roughness of the printing layer is reduced, when the electrode of the wire is provided on the printing layer, the wire electrode can be prevented from being cracked or shorted due to the protrusions formed on the printing layer.

In addition, the straightness of the printing layer is improved, so that the Bezel area of the touch panel can be reduced, and the display area can be increased.

In addition, according to the touch panel of the embodiment, the thickness of the printing layer can be reduced.

In addition, the printing layer includes a photoresist resin composition, so that the adhesive strength between the printing layer and the cover substrate can be improved. Accordingly, the printing layer can be prevented from being delaminated from the cover substrate.

Further, according to the touch panel of the embodiment, when the sensing electrode is connected with the wire electrode, the sensing electrode can be prevented from being cracked or shorted due to the step difference of the printing layer.

In detail, when the printing layer is formed, the printing layer may be formed at a thin thickness through a roll coating scheme. In addition, a pin hole, which may be formed in the surface of the printing layer, can be prevented. Accordingly, since another printing layer is not additionally formed, the whole thickness of the printing layer can be reduced.

Accordingly, when the sensing electrode is connected with the wire electrode on the printing layer, the damage to the sensing electrode caused by the printing layer can be prevented. In addition, when the cover substrate is bonded to another substrate through an adhesive layer, the gap between the printing layer and the adhesive layer resulting from the step difference of the printing layer can be minimized, thereby minimizing the introduction of an air layer infiltrated into the touch panel through the gap.

In other words, according to the touch panel of the embodiment, the sensing electrode can be prevented from being shorted, the delamination of the printing layer can be prevented, and the introduction of air through the gap between the adhesive layer and the printing layer can be minimized, so that the reliability of the whole touch panel can be improved.

In addition, according to the touch panel of the embodiment, the sensing electrode is provided on the cover substrate, the printing layer is provided to partially cover one end of the sensing electrode, the wire electrode is provided on the printing layer, and the sensing electrode is electrically connected with the wire electrode through the conductive member such as the conductive ball positioned on the surface of the printing layer or in the printing layer. Accordingly, the sensing electrode is not affected by the step difference of the printing layer when the sensing electrode is connected with the wire electrode, so that the sensing electrode can be prevented from being cracked and shorted.

In addition, the printing layer is printed through the roll coating scheme, so that the pin hole, which may be generated in the surface of the printing layer, can be prevented. Accordingly, the printing layer can be arranged at a small thickness, so that the step difference of the printing layer can be reduced. Accordingly, when the cover substrate is bonded to another substrate through the adhesive layer, the gap formed between the printing layer and the adhesive layer resulting from the printing layer can be minimized.

Therefore, according to the touch panel of the embodiment, the sensing electrode can be prevented from being shorted, and the printing layer can be prevented from being delaminated. In addition, the introduction of air resulting from the gap between the adhesive layer and the printing layer can be minimized, so that the reliability of the whole touch panel can be improved.

In addition, the touch window of the embodiment includes the connection conductive layer formed by laminating the first connection conductive layer conducted only in the vertical direction and the second connection conductive layer conducted in the horizontal direction, so that the align margin of the first connection conductive layer or the second connection conductive layer can be ensured. The first connection conductive layer is conducted in the vertical direction and insulated in the horizontal direction at the area that heat or pressure is applied. Therefore, although the first connection conductive layer may be partially overlapped with the first sensing electrode, the first sensing electrode and the second sensing electrode, which must be spaced apart from each other, may be prevented from electrically being connected with each other.

In addition, according to the touch window of the embodiment, only the first connection conductive layer interposed between the second connection conductive layer and the second sensing electrode, or between the second connection conductive layer and the second wire electrode is heated or pressurized. In other words, the entire surface of the substrate need not be heated or pressurized. In detail, the substrate is partially heated or pressurized, so that the deformation of the cover substrate can be prevented or minimized.

In addition, according to still another embodiment, the second sensing electrode can be formed on the insulating layer. Accordingly, the connection conductive layer, which is required when the first and second sensing electrodes are formed at the same layer, may be omitted. Therefore, the failure caused by the miss align of the connection conductive layer can be prevented.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch panel comprising:
    a cover substrate including an active area and an unactive area;
    a sensing electrode extending from the active area toward the unactive area;
    a printing layer on the unactive area of the cover substrate; and
    a wire electrode on the printing layer,
    wherein the sensing electrode contacts one surface of the cover substrate,
    wherein the printing layer covers one end of the sensing electrode, and a conductive member is provided in at least one of an inner area of the printing layer and an outer area of the printing layer,
    wherein the printing layer has surface roughness in a range of 0.4 μm to 0.6 μm,
    wherein the printing layer has straightness in a range of ±0.1 μm to ±10 μm, and
    wherein the conductive member includes a conductive ball having a particle size in a range of 5 μm to 10 μm.

2. The touch panel of claim 1, wherein the printing layer includes photoresist resin composition.

3. The touch panel of claim 2, wherein the photoresist resin composition includes at least one of a diazo resin, azide resin, hard coated polyvinyl, acrylic resin, polyamide or polyester.

4. The touch panel of claim 3, wherein the printing layer includes color ink.

5. The touch panel of claim 2, wherein the printing layer is translucent or opaque.

6. The touch panel of claim 1, wherein the printing layer has a thickness in a range of 1 μm to 2 μm.

7. The touch panel of claim 1, wherein the printing layer includes a first printing layer on the cover substrate and a second printing layer on the first printing layer, and a width of the first printing layer is different from a width of the second printing layer.

8. The touch panel of claim 1, further comprising first and second sensing electrodes provided on the active area to extend in directions different from each other,
    wherein the first and second sensing electrodes are provided on a same surface of the cover substrate.

9. The touch panel of claim 8, further comprising a protective layer provided on the printing layer to cover the wire electrode, wherein the protective layer is translucent or opaque.

10. The touch panel of claim 9, wherein the protective layer has a thickness thicker than a thickness of the printing layer.

11. The touch panel of claim 9, wherein the protective layer has a color corresponding to a color of the printing layer.

12. The touch panel of claim 1, wherein the conductive member is provided in an entire area of the printing layer.

13. The touch panel of claim 1, wherein the conductive member is provided at an area in which the printing layer is overlapped with the sensing electrode.

14. The touch panel of claim 1, wherein the wire electrode is connected with the sensing electrode through the conductive member at an area in which the printing layer is overlapped with the sensing electrode.

15. The touch panel of claim 1, wherein the sensing electrode comprises:
    a first sensing electrode extending in a first direction at the active area, and a second sensing electrode extending in a second direction different from the first direction at the active area, wherein the touch panel further includes an insulating layer on the first sensing electrode to expose the second sensing electrode, and the printing layer includes the conductive member serving as a first connection conductive layer, and is connected with the exposed second sensing electrode.

16. The touch panel of claim 15, further comprising a second connection conductive layer provided on the first connection conductive layer to overlap with the second sensing electrode while interposing the first connection conductive layer between the second connection conductive layer and the second sensing electrode.

17. The touch panel of claim 15, wherein the first connection conductive layer is conducted in a vertical direction and insulated in a horizontal direction.

* * * * *